United States Patent
Wallman et al.

(10) Patent No.: US 10,360,088 B2
(45) Date of Patent: Jul. 23, 2019

(54) RANDOMIZED COMPILING FOR QUANTUM COMPUTATION

(71) Applicant: Quantum Benchmark, Inc., Kitchener (CA)

(72) Inventors: Joel J. Wallman, Kitchener (CA); Joseph Emerson, Kitchener (CA)

(73) Assignee: Quantum Benchmark, Inc., Kitchener, Ontario (CA)

(*) Notice: Subject to any disclaimer, the term of this patent is extended or adjusted under 35 U.S.C. 154(b) by 0 days.

(21) Appl. No.: 15/357,775

(22) Filed: Nov. 21, 2016

(65) Prior Publication Data
US 2017/0308803 A1    Oct. 26, 2017

Related U.S. Application Data

(60) Provisional application No. 62/258,231, filed on Nov. 20, 2015.

(51) Int. Cl.
| | | |
|---|---|---|
| B82Y 10/00 | (2011.01) | |
| G06F 11/00 | (2006.01) | |
| G06F 17/11 | (2006.01) | |
| G06N 10/00 | (2019.01) | |
| H03K 19/195 | (2006.01) | |

(52) U.S. Cl.
CPC ............ *G06F 11/004* (2013.01); *G06F 17/11* (2013.01); *G06N 10/00* (2019.01); *B82Y 10/00* (2013.01); *G06F 2201/82* (2013.01); *H03K 19/195* (2013.01)

(58) Field of Classification Search
CPC .............................. G06N 99/002; B82Y 10/00
See application file for complete search history.

(56) References Cited

U.S. PATENT DOCUMENTS

| | | | |
|---|---|---|---|
| 8,219,871 B2 | 7/2012 | Roetteler | |
| 9,934,468 B2* | 4/2018 | Mohseni | G06N 99/002 |
| 2009/0259905 A1* | 10/2009 | Silva | B82Y 10/00 |
| | | | 714/746 |
| 2015/0324705 A1 | 11/2015 | Biercuk et al. | |

FOREIGN PATENT DOCUMENTS

| | | |
|---|---|---|
| AU | 2013277927 | 1/2015 |
| WO | 2009/117003 | 9/2009 |
| WO | 2013/188910 | 12/2013 |

OTHER PUBLICATIONS

O.Kern, Randomized Dynamical Decoupling Strategies and Improved One-Way Rates for Quantum Cryptography, Dissertation, arXiv:quant-ph/0906.2927v2, 2009 (Year: 2009).*

(Continued)

*Primary Examiner* — Matthew D Sandifer
*Assistant Examiner* — Emily E Larocque
(74) *Attorney, Agent, or Firm* — Morgan, Lewis & Bockius LLP

(57) ABSTRACT

In a general aspect, randomized compiling techniques for quantum computing are described. In some aspects, an initial quantum-logic gate sequence is received. A modified quantum-logic gate sequence is generated by applying virtual random gates to the initial quantum-logic gate sequence, such that the initial quantum-logic gate sequence is logically equivalent to the modified quantum-logic gate sequence. The modified quantum-logic gate sequence can be provided to a quantum information processor for execution.

18 Claims, 10 Drawing Sheets

(56) References Cited

OTHER PUBLICATIONS

Lorenza, V., & Knill, E., "Random Decoupling Schemes for Quantum Control and Error Suppression," Physical Review Letters, PRL 94, 060502 (2005), Feb. 17, 2005, 4 pgs.

Santos, L. F., & Lorenza, V., "Enhanced Convergence and Robust Performance of Randomized Dynamical Decoupling," Physicai Review Letters, PRL 97, 150501 (2006), Oct. 13, 2006., 4 pgs.

Magesan, E., Gambetta, J. M., & Emerson, J., "Characterizing quantum gates via randomized benchmarking," arXiv:1109.6887 [quant-ph], Apr. 27, 2012., 19 pgs.

Magesan, E., Gambetta, J. M., & Emerson, J., "Robust Randomized Benchmarking of Quantum Processes," arXiv:1009.3639v1 [quant-ph], Sep. 19, 2010., 5 pgs.

Magesan et al., "Efficient Measurement of Quantum Gate Error by Interleaved Randomized Benchmarking," arXiv:1203.4550v2 [quant-ph], Mar. 19, 2014, 5 pgs.

Knill, E., "Quantum computing with realistically noisy devices," arXiv:quant-ph/0410199, Nov. 2, 2004, 47 pgs.

Knill et al., "Randomized benchmarking of quantum gates," arXiv:0707.0963 [quant-ph], Jul. 6, 2007, 13 pgs.

Kern, O., Alber, G., & Shepelyansky, D.L., "Quantum error correction of coherent errors by randomization," arXiv:quant-ph/0407262, Jul. 30, 2004, 4 pgs.

Kern, O., & Alber, G., "Selective recoupling and stochastic dynamical decoupling," arXiv:quant-ph/0602167, Feb. 20, 2006, 9 pgs.

Kern, O., & Alber, G., "Controlling Quantum Systems by Embedded Dynamical Decoupling Schemes," arXiv:quant-ph/0506038, Jun. 5, 2005, 4 pgs.

Emerson, J., Alicki, R., and Zyczkowski, K., "Scalable noise estimation with random unitary operators", arXiv:quant-ph/0503243, Dec. 16, 2005, 8 pgs.

Emerson et al., "Symmetrized Characterization of Noisy Quantum Processes," American Association for the Advancement of Science, Science 317, 1893 (2007); downloaded from <http://www.sciencemag.org> on Apr. 23, 2012, 5 pgs.

Dankert et al., "Exact and approximate unitary 2-designs and their application to fidelity estimation", arXiv:quant-ph/0606161, Aug. 31, 2012, 6 pgs.

Wallman, Joel, J., & Emerson, J., "Noise tailoring for scalable quantum computation via randomized compiling," arXiv:1512.01098v3 [quant-ph] Jun. 9, 2016.

\* cited by examiner

RANDOMIZED COMPILING FOR QUANTUM COMPUTATION

CROSS-REFERENCE TO RELATED APPLICATIONS

This application claims the benefit of U.S. Provisional Application No. 62/258,231, filed Nov. 20, 2015, entitled "Randomized Compiling for Quantum Computation," the entire contents of which are hereby incorporated by reference.

GOVERNMENT SUPPORT

This invention was made with government support under grant W911NF-14-1-0103 awarded by the U.S. Army Research Office. The government has certain rights in the invention.

BACKGROUND

The following description relates to randomized compiling for quantum computation.

The rich complexity of quantum states and processes enables powerful new protocols for processing and communicating quantum information, as illustrated, for example, by Shor's factoring algorithm, quantum simulation algorithms, and others. However, the same rich complexity of quantum processes that makes them useful also allows a large variety of errors to occur. Errors in a quantum computation arise from a variety of sources, including decoherence and imperfect control, where the latter can lead to coherent (unitary) errors. Fault-tolerant quantum computation can be performed in the presence of such errors provided they occur with at most some maximum threshold probability.

DETAILED DESCRIPTION

Figure 1:
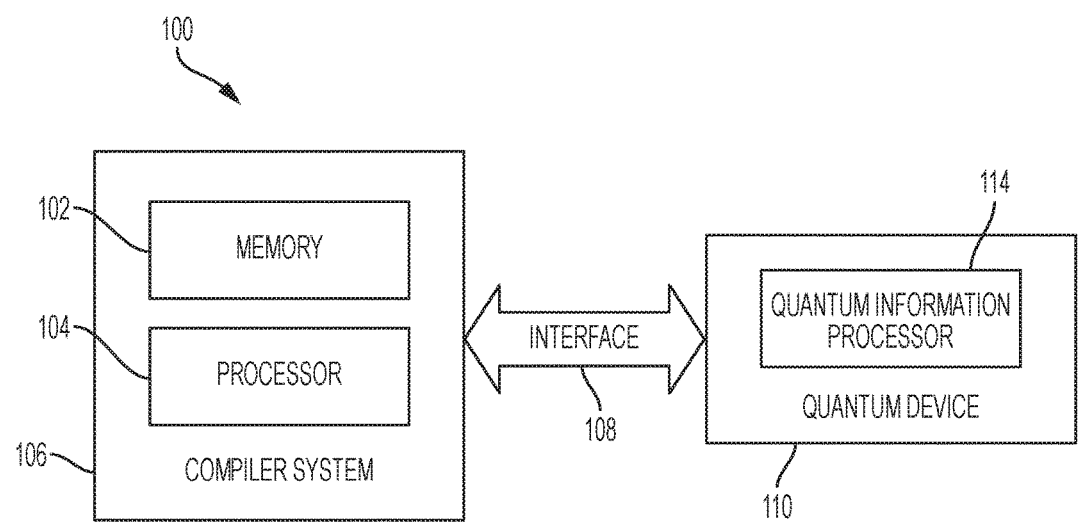
FIG. 1 is a schematic diagram showing aspects of an example system that includes a compiler system and a quantum device.

In some aspects of what is described here, randomized compiling techniques can convert (or "tailor") coherent errors into stochastic errors, leading to a reduction in worst-case errors while keeping the average error rate fixed. Such compiling techniques can be used to reduce coherent errors in quantum information processing devices, and in some instances, to achieve fault-tolerant quantum computation.

Some example randomized compiling techniques can achieve a noise reduction (or noise "tailoring"). In some cases, a general technique can be used, for instance, for universal quantum computation, and a variant technique can be used for, for instance, for fault-tolerant quantum computation via stabilizer codes. The compiling techniques may be implemented in a manner that is robust under realistic noise models (e.g., under gate-dependent coherent errors).

In some implementations, instead of compiling a gate sequence for a given quantum algorithm into machine code (e.g., pulse sequences, pulse programs, control sequences, etc.) deterministically in one fixed way, virtual random single-qubit gates are introduced into the compiled code, leading to a set of compiled versions of the code that are algorithmically equivalent. The average over these compiled versions has the net effect of creating an effective error model that is stochastic (not coherent). In some cases, the virtual random gates can be implemented as Pauli gates, dihedral gates or other types of gates.

In some implementations, the set of randomized circuits are precomputed. In some implementations, each randomized version can be computed on the fly, for example, using fast classical electronics that control the quantum computation in progress. For instance, the randomized gate sequence at each clock cycle can be computed from information that is local (in space and time). As an example, the randomized gate sequence at each clock cycle may depend only on the bare gates and randomized versions of those gates in the current clock cycle and one adjacent clock cycle (e.g., the previous clock cycle).

Randomized compiling techniques may, in some implementations, achieve one or more of the following advantages, for example, for universal quantum computing or other applications. In some instances, the resulting stochastic noise has a worst-case error rate that can be orders of magnitude lower than under the pre-tailored version of the noise. In some instances, the resulting stochastic noise is guaranteed to satisfy the conditions required for the highest-threshold proofs of fault-tolerant quantum computation (which are orders of magnitude higher). In some instances, the resulting stochastic noise has a worst-case error rate that can be directly estimated via existing experimental techniques (e.g., randomized benchmarking methods), enabling certification of scalability under reasonable assumptions. In some instances, the resulting tailored noise accumulates only linearly instead of quadratically in the length of the circuit. In some instances, randomized compiling may provide decoupling from the environment (e.g., generalizing randomized dynamical decoupling) and reduce the average computational error.

The randomized compiling techniques described here may be used in a number of applications and contexts. For example, in quantum information processing applications, such as quantum simulation and the use of small quantum information processors for repeaters and sensors, tailored (stochastic) noise can evade worst-case scenarios for cumulative noise over a circuit due to the accumulation of coherent errors, and may achieve one or more of the other advantages identified in the preceding paragraph. In some cases, to implement the randomized compiling techniques described here on a quantum device, the experimental overhead cost is relatively small (the gate depth remains unchanged) and the technique can be implemented on the fly, for example, via fast classical control with minimal memory requirements (e.g., instead of pre-compiling all the different but equivalent versions of the quantum algorithm in advance).

FIG. 1 is a schematic diagram showing aspects of an example system 100 that includes a compiler system 106, a quantum device 110 and an interface 108. The quantum device 110 includes a quantum information processor 114. The interface 108 provides communication between the compiler system 106 and the quantum device 110. The system 100 may include additional or different features, and the components of the system 100 may be configured to operate as discussed with respect to FIG. 1 or in another manner.

The example compiler system 106 has computational resources (e.g., hardware, software, firmware) that are used to produce executable instructions (e.g., machine code) for the quantum device 110. In some implementations, the compiler system 106 can be implemented as a classical computer system, such as, for example, a laptop computer, a desktop computer, a computer workstation, a server, a server cluster, a mainframe, or another type of classical computer system. As shown in FIG. 1, the example compiler system 106 includes a memory 102 and a processor 104. The compiler system 106 may include other components, and may be configured to operate in another manner.

In some instances, the memory 102 of the compiler system 106 stores quantum-logic source code to be executed by the quantum information processor 114. For instance, the quantum-logic source code may be stored as quantum-logic gate sequences, quantum-logic circuits, quantum algorithms or other representations of quantum-logic. In some instances, the processor 104 of the compiler system 106 converts the quantum-logic source code into machine code that can be executed by the quantum information processor 114. For instance, the machine code may be stored as a pulse sequence (e.g., radio frequency, microwave frequency, optical frequency), a pulse program, or another type of control sequence configured for execution by the quantum information processor 114. The machine code can be stored on the memory 102 of the compiler system 106, transferred to the quantum device 110 via the interface 108, or handled in another manner.

The example memory 102 can include, for example, random access memory (RAM), a storage device (e.g., a writable read-only memory (ROM) or others), a hard disk, or another type of storage medium. The example memory 102 can store instructions (e.g., computer code, a computer program, etc.) associated with an operating system, computer applications and other resources. The memory 102 can also store application data and data objects that can be interpreted by one or more applications or virtual machines running on the compiler system 106. In some cases, the memory 102 stores computer-readable instructions for software applications, scripts, programs, functions, executables or other modules that are executed by the processor 104. For example, the computer-readable instructions may be configured to perform one or more of the operations shown in FIG. 2.

The example processor 104 can execute instructions, for example, to generate output data based on data inputs. For example, the processor 104 can run computer programs by executing the software, scripts, programs, functions, executables, or other modules stored in the memory 102. In some instances, the processor 104 may perform one or more of the operations shown in FIG. 2. The example processor 104 shown in FIG. 1 can include one or more chips or chipsets that include analog circuitry, digital circuitry or a combination thereof. In some cases, the processor 104 includes multiple processor devices such as, for example, one or more main processors and one or more co-processors.

In some aspects of operation, the compiler system 106 obtains quantum-logic source code (e.g., a quantum-logic gate sequence, a quantum-logic circuit, a quantum algorithm, etc.), modifies the quantum-logic source code, and provides the modified quantum-logic source code to the quantum device 110 for execution by the quantum information processor 114. For instance, the quantum-logic source code can be modified to reduce the effects of noise in the quantum information processor 114. FIGS. 3A-3C and 4A-4E show examples of how quantum-logic source code can be modified to tailor noise in a quantum information processor. The compiler system 106 may compile portions (e.g., one or more clock cycles) of the quantum-logic source code "on-the-fly" while the quantum information processor 114 executes earlier-compiled portions (e.g., earlier clock cycles). For instance, each cycle of the modified quantum-logic source code may be provided to the quantum device 110 individually. The compiler system 106 may pre-compile the quantum-logic source code before the quantum information processor 114 begins execution. For instance, all cycles of the modified quantum-logic source code may be provided to the quantum device 110 together. The compiler system 106 may operate in another manner.

The example quantum device 110 can be a quantum computer, a quantum sensor, a quantum repeater or another type of device that operates using a quantum information processor. For example, the quantum device 110 may be a universal quantum computer that operates in a fault-tolerant regime and can be programmed and re-programmed to perform computations. As another example, the quantum device 110 may be a quantum repeater that performs quantum error correction in an optical network used for quantum key distribution scheme. As another example, the quantum device 110 can be a quantum sensor that can measure physical properties of an external system based on quantum interactions or phenomena.

The example quantum information processor 114 can include hardware, software, firmware, or combinations thereof configured to process quantum information. The quantum information processor 114 can be implemented using any suitable computing architecture or physical modality for quantum computing (e.g., trapped ion systems, SQUID-based systems, spin-based systems, optical systems, etc.). The quantum information processor 114 may be programmed, or it maybe programmable, to realize a quantum-logic circuit or multiple quantum-logic circuits. For example, the quantum information processor 114 may be programmed to perform one or more the operations shown in FIGS. 3A-3C and 4A-4E. The quantum information processor 114 can be a universal quantum computer, or the quantum information processor 114 can be a quantum computer without universal quantum computation capabilities.

The example quantum information processor 114 can store quantum information in a Hilbert space defined by a quantum system. The quantum information processor 114 can store any suitable number of qubits (i.e., quantum bits), and the Hilbert space can be any suitable size. For example, the quantum information processor 114 can store n qubits in a $2^n$-dimensional Hilbert space. The quantum information processor 114 can perform quantum computing operations that manipulate the quantum information in the Hilbert space. For example, the quantum information processor 114 may coherently control the quantum system and preserve the relative phases of the qubits. If the quantum information processor 114 is a universal quantum computer, it can generally create any coherent state in the Hilbert space. The quantum information processor 114 can be configured to measure the state of the quantum system in a suitable basis. For example, the quantum information processor 114 may be configured to measure one or more of the qubits in a computational basis.

The quantum information processor 114 may be subject to noise that can create errors. The noise can include, for example, coherent noise processes, incoherent noise processes, or decoherent noise processes. In some cases, the quantum information processor 114 can perform a quantum error correction process that effectively counteracts the noise. In some cases, the compiler system 106 can modify quantum-logic source code to tailor the noise affecting the quantum information processor 114. For example, the compiler system 106 can convert an arbitrary noise process into stochastic Pauli noise in some instances.

The example interface 108 can include all or part of a connector, a data communication network or another type of communication link. For example, the interface 108 can include one or more wired or wireless connections, one or more wired or wireless networks or other communication channels. In some examples, the interface 108 includes a Local Area Network (LAN), a Wide Area Network (WAN), a private network, a Virtual Private Network (VPN), a public network (such as the Internet), a peer-to-peer network, a cellular network, a Wi-Fi network, a Personal Area Network (PAN) or another type of data communication network. In some examples, the interface 108 includes a wired communication interface (e.g., USB, Ethernet, coaxial, optical) that can be connected directly or indirectly between the compiler system 106 and the quantum device 110.

Figure 2:
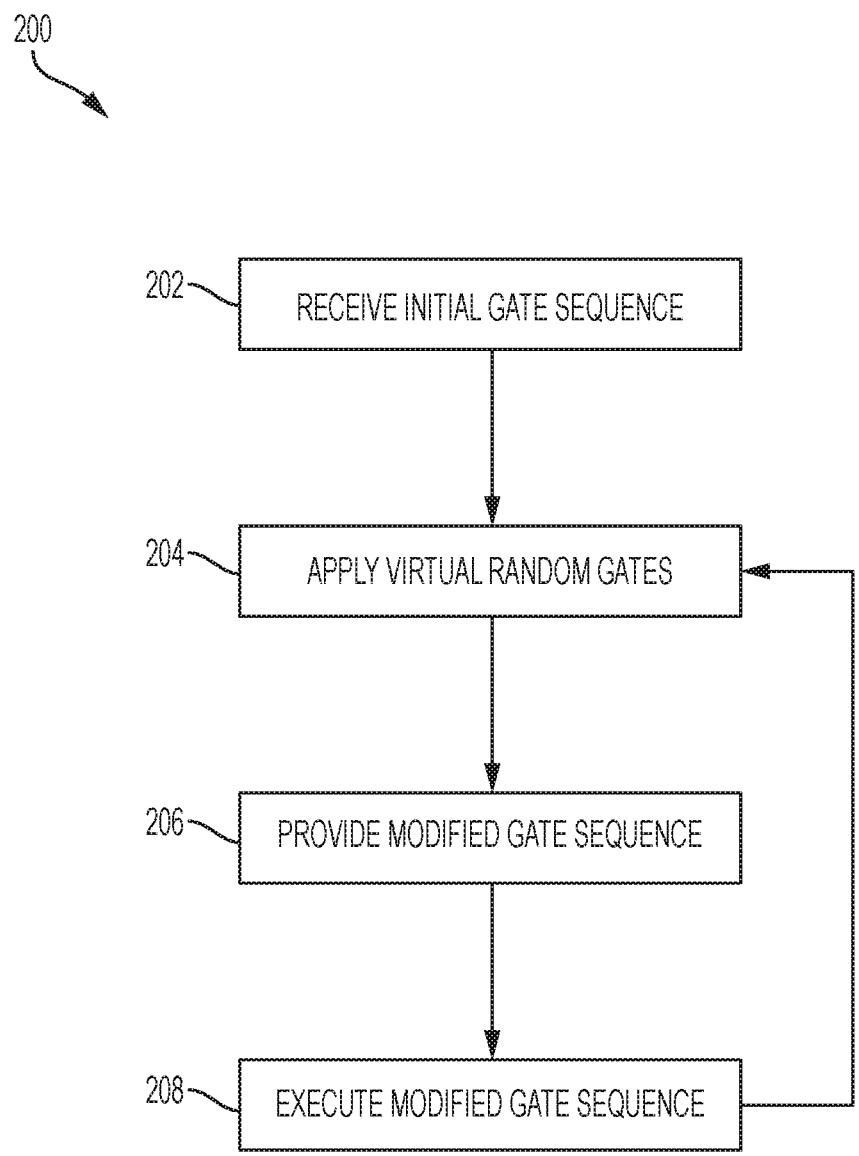
FIG. 2 is a flow chart showing an example quantum computation process.

FIG. 2 is a flow chart showing an example quantum computation process 200. The example process 200 can be performed, for example, by a computer system, by the example system 100 shown in FIG. 1 or by another type of system. In some cases, one or more of the operations shown in FIG. 2 are implemented as processes that include multiple operations, sub-processes or other types of routines. In some cases, operations can be combined, performed in parallel, iterated or otherwise repeated or performed in another manner.

At 202, an initial gate sequence is received. As an example, the initial gate sequence can be received by a compiler system (e.g., the compiler system 106 shown in FIG. 1 or another compiler system). The initial gate sequence is an initial quantum-logic gate sequence representing quantum-logic to be executed by a quantum information processor (e.g., by the quantum information processor 114 shown in FIG. 1 or another type of quantum information processor). For example, the initial quantum-logic gate sequence can be in the form of quantum-logic source code, or the initial quantum-logic gate sequence can be in another form or format. The initial gate sequence can be received from memory, from an external system, from a processor or another source.

Figure 3A:
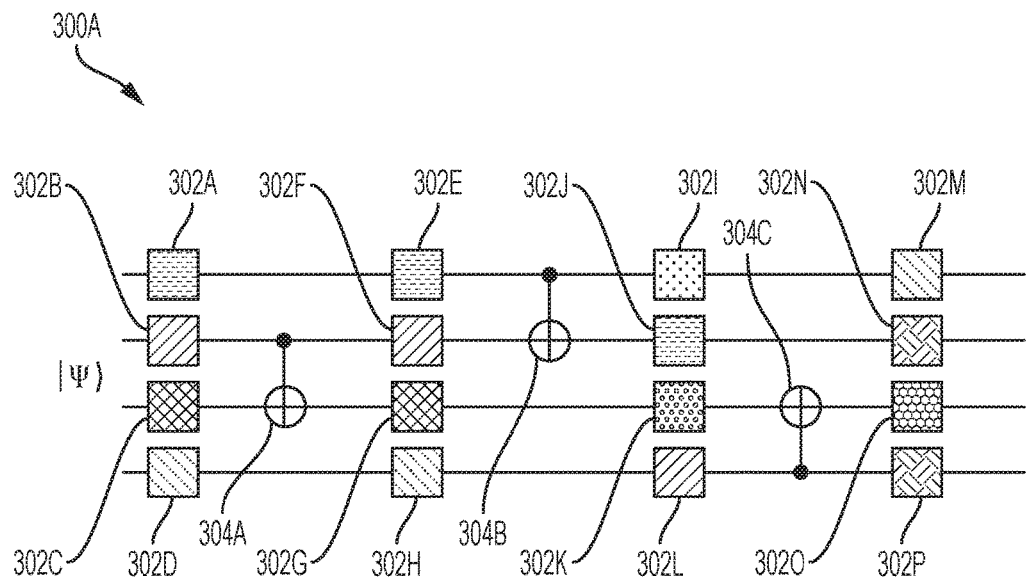
FIG. 3A shows an example of an initial quantum-logic gate sequence.

In some implementations, the initial quantum-logic gate sequence includes a series of cycles (e.g., clock cycles or other types of cycles). Each cycle can include a set of single-qubit gates (i.e., quantum-logic operations applied to individual qubits) and a set of multi-qubit gates (i.e., quantum-logic operations applied to multiple qubits). An example of an initial quantum-logic gate sequence that includes a series of cycles is shown in FIG. 3A.

At 204, virtual random gates are applied to the initial gate sequence. The virtual random gates can be applied by a data processing apparatus of the compiler system (e.g., by operation of the processor 104 shown in FIG. 1 or another type of processor). A modified quantum-logic gate sequence is generated by applying virtual random gates to the initial quantum-logic gate sequence. For instance, random gates can be effectively inserted in the initial quantum-logic gate sequence and combined with the quantum-logic gates to form a new, modified quantum-logic gate sequence. In some cases, all of the virtual random gates are single-qubit quantum-logic operations. For instance, the virtual random gates can be virtual random Pauli gates or dihedral gates. Virtual random Pauli gates are virtual gates randomly selected from the standard set of single-qubit Pauli gates $\{X, Y, Z\}$. Virtual random dihedral gates are virtual gates compiled from a randomly selected element of the standard set of single-qubit Pauli gates and a random power of the standard single-qubit phase gate.

In some implementations, the virtual random gates are configured to reduce the effect of noise in the quantum information processor. For example, the virtual random gates can be configured to convert coherent errors in the quantum information processor into stochastic errors in the quantum information processor. Coherent errors are created by coherent noise processes, such as, for example, noise processes that produce unitary operations in the Hilbert space of the quantum information processor. Stochastic errors are created by stochastic noise processes, such as, for example, randomly-applied Pauli operations. Stochastic noise processes lack coherence, and are generally statistical in nature. In some instances, stochastic errors can be tolerated more easily than coherent errors in a quantum information processor. Accordingly, applying the virtual random gates may improve performance of the quantum information processor, for instance, by reducing or modifying errors.

The virtual random gates can be applied in a manner that ensures the initial quantum-logic gate sequence is logically equivalent to the modified quantum-logic gate sequence. For instance, the virtual random gates can be applied in pairs, such that the first virtual random gate in each pair is inverted by the second virtual random gate in the pair. In cases where the initial quantum-logic gate sequence includes a series of cycles, the modified quantum-logic gate sequence can be generated by applying virtual random gates in each cycle of the initial quantum-logic gate sequence. For instance, after the initial cycle in the series, a portion of the virtual random gates applied in each cycle can be configured to invert one or more of the virtual random gates applied in the preceding cycle. In some cases, a pair of virtual random gates is applied to each qubit in each cycle.

At 206, a modified gate sequence is provided. The modified gate sequence provided at 206 is a modified quantum-logic gate sequence, which is provided to the quantum information processor for execution. Providing the modified quantum-logic gate sequence to be executed by the quantum information processor can include converting the modified quantum-logic gate sequence into machine code (e.g., a pulse program, pulse sequence, control sequence, etc.) that is executable by the quantum information processor. In the example shown in FIG. 1, the compiler system 106 can convert the modified quantum-logic gate sequence from quantum-logic source code to machine code that can be executed by the quantum information processor 114. The machine code can be delivered to the quantum information processor, for instance, by transferring digital information to the quantum information processor. In the example shown in FIG. 1, machine code generated by the compiler system 106 can be delivered to the quantum information processor 114 by communicating the machine code through the interface 108. The machine code may be delivered as computer file, computer code, an electronic document or in another format, and the machine code may be delivered in any suitable form (e.g., binary, text, or other digital form).

At 208, the modified gate sequence is executed. For example, the quantum information processor may execute the machine code representing the modified quantum-logic gate sequence. In some implementations, the quantum information processor converts the machine code into physical control signals that interact with the qubits and cause the quantum information processor to execute the quantum-logic represented by the modified quantum-logic gate sequence (and equivalently by the initial quantum-logic gate sequence). As an example, when the machine code takes the form of a pulse sequence, the quantum information processor may convert the pulse sequence into pulses (e.g., radio-frequency pulses, microwave pulses, optical pulses, etc.) that manipulate the quantum states of the qubits in the quantum information processor.

As shown in FIG. 2, the operations 204, 206, 208 may be performed in an iterative manner. For instance, each iteration of operations 204, 206, 208 may apply a different set of virtual random gates at 204. In some cases, the set of virtual random gates applied at 204 on each iteration of the process 200 is determined independent of the set of virtual random gates applied at 204 on other iterations. Thus, a distinct modified quantum-logic gate sequence may be provided at 206 upon each iteration of the process 200, and each distinct modified quantum-logic gate sequence may be logically equivalent to the initial quantum-logic gate sequence received at 202. A different set of errors may be produced by executing each distinct modified quantum-logic gate sequence at 208. For instance, the noise affecting the quantum information processor may be gate-dependent, temporally-dependent, state-dependent or otherwise vary under the distinct properties of each modified quantum-logic gate sequence.

The process 200 may be iterated, for example, for a specified number of iterations, for a specified duration of time, or until another condition is met, and the outcomes from multiple executions can be averaged or combined. In some implementations, averaging over multiple executions of the process (and therefore averaging over the errors produced by multiple distinct, modified quantum-logic gate sequences) can reduce the overall or statistical effects of noise in the quantum information processor.

Figure 3B:
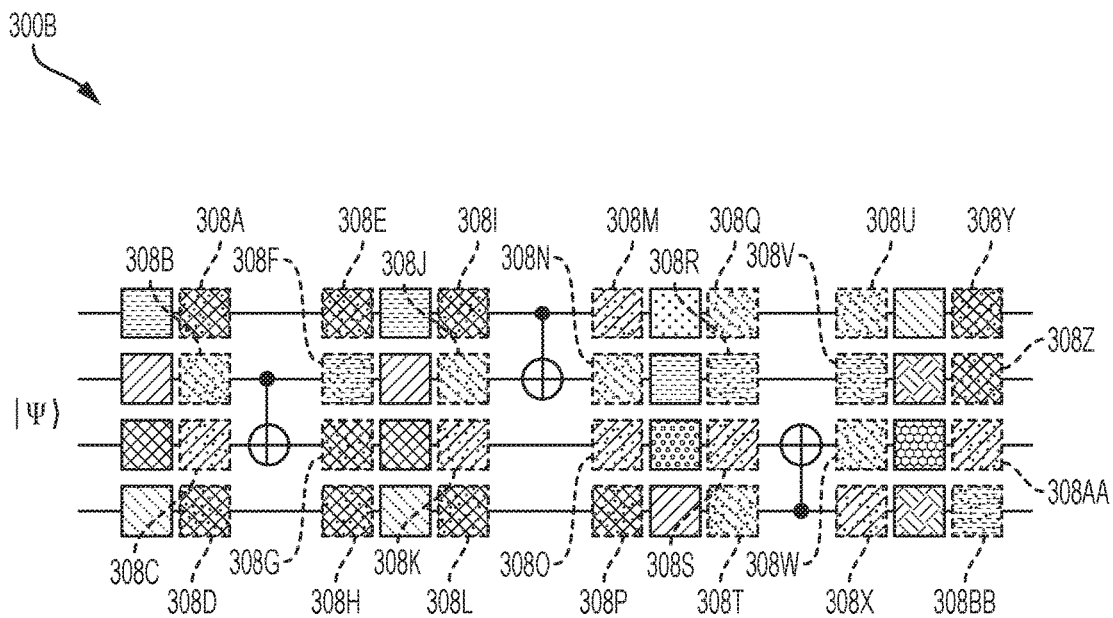
FIG. 3B shows an example of a modified quantum-logic gate sequence.
Figure 3C:
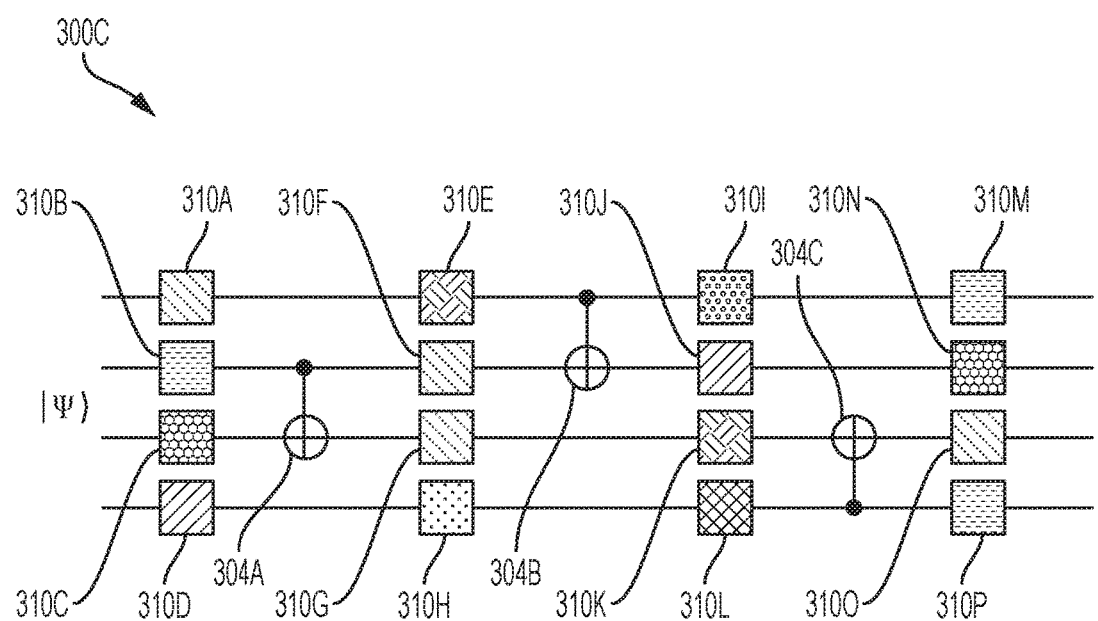
FIG. 3C shows another example of a modified quantum-logic gate sequence 300C.

FIGS. 3A, 3B, and 3C are schematic diagrams showing an example of noise tailoring applied to a quantum-logic gate sequence. FIG. 3A shows an example of an initial quantum-logic gate sequence 300A. FIG. 3B shows an example of a modified quantum-logic gate sequence 300B, which is the initial quantum-logic gate sequence 300A of FIG. 3A with virtual random gates 308 inserted. FIG. 3C shows another example of a modified quantum-logic gate sequence 300C, which is the initial quantum-logic gate sequence 300A of FIG. 3A transformed by application of the virtual random gates 308 shown in FIG. 3B.

The example initial quantum-logic gate sequence 300A shown in FIG. 3A includes three-and-a-half cycles of quantum-logic gates applied to four qubits. Each cycle includes a single-qubit gate applied to each qubit, and a two-qubit gate 304 applied to a pair of the qubits. For example, in the first full cycle, a single-qubit gate 302A is applied to the first qubit, a single-qubit gate 302B is applied to the second qubit, a single-qubit gate 302C is applied to the third qubit, a single-qubit gate 302D is applied to the third qubit, and then a two-qubit gate 304A (a controlled-not gate, in this example) is applied to the second and third qubits. The single-qubit gates and the two-qubit gates in FIG. 3A are collectively referred to as "single-qubit gates 302" and "two-qubit gates 304," respectively. Generally, each of the single-qubit gates 302 in the initial quantum-logic gate sequence 300A may be different from the others, and each of the two-qubit gates 304 in the initial quantum-logic gate sequence 300A may be different from the others.

The example modified quantum-logic gate sequence 300B shown in FIG. 3B includes virtual random gates 308 inserted into the initial quantum-logic gate sequence 300A. For example, in the first cycle, a single-qubit virtual random gate 308A is applied to the First qubit, a single-qubit virtual random gate 308B is applied to the second qubit, a single-qubit virtual random gate 308C is applied to the third qubit, a single-qubit virtual random gate 308D is applied to the fourth qubit. The virtual random gates in FIG. 3B are collectively referred to as "virtual random gates 308." The attributes of each virtual random gate can be determined by a random process, for example, independent of the initial quantum-logic gate sequence 300A.

In the example shown in FIG. 3B, the virtual random gates 308 are applied in pairs, one before the two-qubit gate of each cycle and the other after the two-qubit gate of the cycle. The second virtual random gate in each pair inverts the first virtual random gate in the pair when commuted through the two-qubit gate. As an example, the virtual random gates 308E, 308H applied to the first and fourth qubits are the inverse of (i.e., they invert) the virtual random gates 308A, 308D, respectively. Similarly, the virtual random gates 308F, 308G applied to the second and third qubits are the inverse of (i.e., they invert) the virtual random gates 308B, 308C, respectively, when commuted through the two-qubit gate 304A. Because each of the virtual random gates 308 is inverted, the modified quantum-logic gate sequence 300B shown in FIG. 3B is logically equivalent to the initial quantum-logic gate sequence 300A shown in FIG. 3A.

The example modified quantum-logic gate sequence 300C shown in FIG. 3C is the modified quantum-logic gate sequence 300B of FIG. 3B, where the virtual random gates 308 have been combined with the adjacent single-qubit gates 302. For example, the modified single-qubit gate 310A is logically equivalent to the single-qubit gate 302A (from the initial quantum-logic gate sequence 300A) followed by the virtual random gate 308A. Similarly, the modified single-qubit gate 310F is logically equivalent to the virtual random gate 308F followed by the single-qubit gate 302F (from the initial quantum-logic gate sequence 300A) followed by the virtual random gate 308J.

Accordingly, the modified quantum-logic gate sequence 300C shown in FIG. 3C is logically equivalent to the modified quantum-logic gate sequence 300B shown in FIG. 3B and the initial quantum-logic gate sequence 300A shown in FIG. 3A. Thus, the modified quantum-logic gate sequence 300C shown in FIG. 3C represents the initial quantum-logic gate sequence 300A shown in FIG. 3A transformed by application of the virtual random gates 308 shown in FIG. 3B. Like the initial quantum-logic gate sequence 300A shown in FIG. 3A, each cycle in the modified quantum-logic gate sequence 300C includes a single-qubit gate applied to each qubit, and a two-qubit gate 304 applied to a pair of the qubits.

Figure 4A:
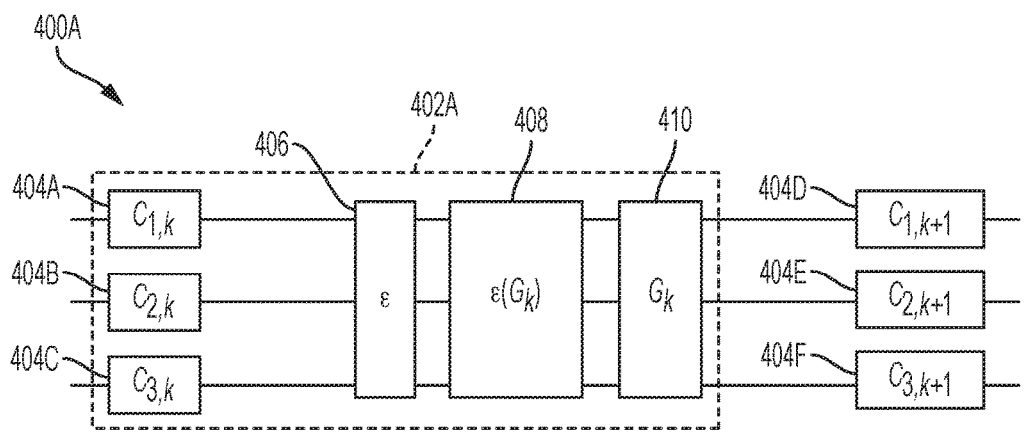
FIG. 4A shows an example of an initial quantum-logic circuit.
Figure 4B:
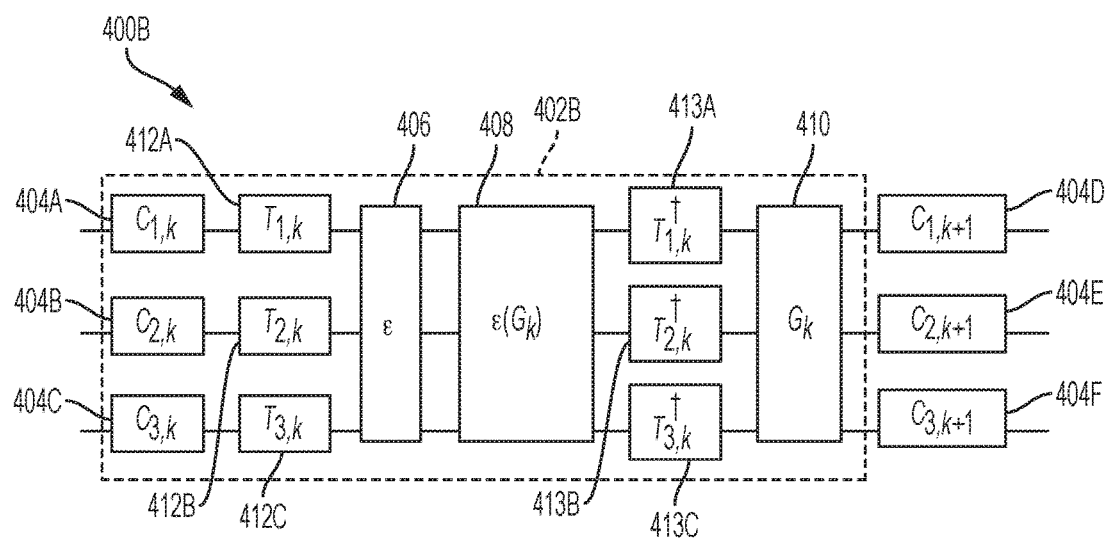
FIG. 4B shows an example of a modified quantum-logic circuit
Figure 4C:
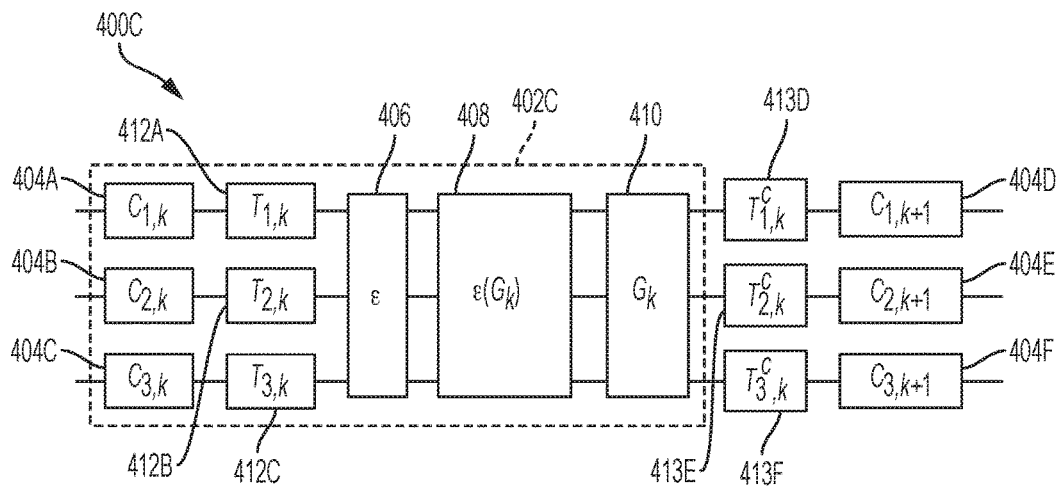
FIG. 4C shows another example of a modified quantum-logic circuit
Figure 4D:
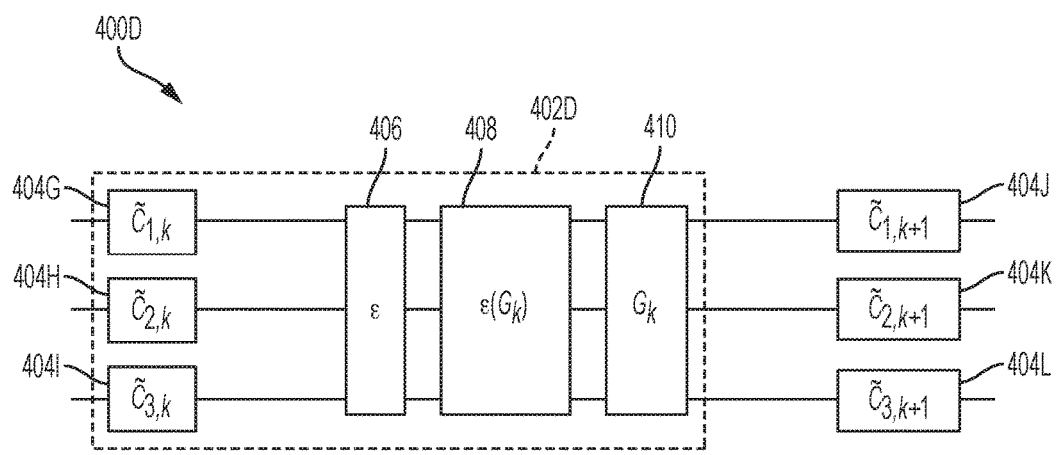
FIG. 4D shows another example of a modified quantum-logic circuit.
Figure 4E:
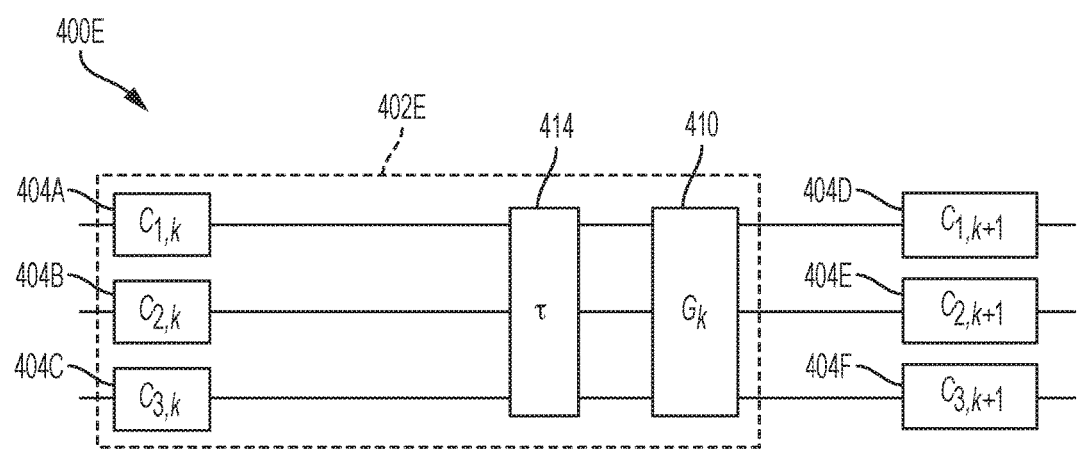
FIG. 4E shows a noise-tailored quantum-logic circuit.

FIGS. 4A, 4B, 4C, 4D and 4E are schematic diagrams showing an example of noise tailoring applied to a quantum-logic circuit. FIG. 4A shows an example of an bare quantum-logic circuit 400A. FIG. 4B shows an example of a modified quantum-logic circuit 400B, which is the bare quantum-logic circuit 400A of FIG. 4A with twirling gates 412 and correction gates 413 inserted. FIG. 4C shows an example of a modified quantum-logic circuit 400C, which is the modified quantum-logic circuit 400B of FIG. 4B with the correction gates 413 repositioned. FIG. 4D shows an example of a modified quantum-logic circuit 400D, which is the modified quantum-logic circuit 400C of FIG. 4C with the twirling gates 412 and correction gates 413 combined with adjacent single-qubit gates 404. FIG. 4E shows an example of a noise-tailored quantum-logic circuit 400E, which is the modified quantum-logic circuit 400D of FIG. 4D averaged over multiple realizations.

The bare quantum-logic circuit 400A shown in FIG. 4A includes the k-th cycle 402A of quantum-logic gates and part of a subsequent (k+1)-th cycle of quantum-logic gates. Each cycle includes an "easy" single-qubit gate 404 applied to each qubit, and a set of one or more "hard" gates 410 applied to one or more qubits. In particular, the k-th cycle 402A includes a single-qubit gate 404A applied to the first qubit, a single-qubit gate 404B applied to the second qubit and a single-qubit gate 404C applied to the third qubit; and the one or more gates 410 may generally include one or more multi-qubit gates applied to respective pairs of the qubits. In some cases, one or more of the "easy" or "hard" gates can be an identity operation (and may therefore be omitted) in one or more cycles of the bare quantum-logic circuit 400A. The single-qubit gates in FIG. 4A are collectively referred to as "single-qubit gates 404."

Noise affecting an execution of the bare quantum-logic circuit 400A by a quantum information processor is also represented in FIG. 4A. In particular, the noise affecting an execution of the k-th cycle 402A is represented as a fixed noise channel 406 and a gate-dependent noise channel 408. The fixed noise channel 406 does not depend on the particular gates executed by the quantum information processor, while the gate-dependent noise channel 408 does depend on the particular gates executed by the quantum information processor.

The modified quantum-logic circuit 400B shown in FIG. 4B includes a k-th cycle 402B that has been modified by the insertion of twirling gates 412 and correction gates 413 into the k-th cycle 402A of the bare quantum-logic circuit 400A. In particular, the k-th cycle 402B includes a twirling gate 412A and a corresponding correction gate 413A applied to the first qubit, a twirling gate 412B and a corresponding correction gate 413B applied to the second qubit and a twirling gate 412C and a corresponding correction gate 413C applied to the third qubit. The twirling gates and the correction gates in FIG. 4B are collectively referred to as "twirling gates 412" and "correction gates 413," respectively.

The attributes of each twirling gate 412 can be determined by a random process, for example, independent of the bare quantum-logic circuit 400A. The correction gate 413 applied to each qubit is the logical inverse of the twirling gate 412 applied to the qubit. As an example, the correction gate 413A is the inverse of the twirling gate 412A. Because each of the twirling gates 412 is inverted, the modified quantum-logic circuit 400B shown in FIG. 4B is logically equivalent to the bare quantum-logic circuit 400A shown in FIG. 4A.

The modified quantum-logic circuit 400C shown in FIG. 4C includes a k-th cycle 402C that has been modified by the removing the correction gates 413A, 413B, 413C from the k-th cycle 402B of the modified quantum-logic circuit 400B.

In FIG. 4C, the correction gates 413A, 413B, 413C have been commuted through the "hard" gates 410 to form modified correction gates 413D, 413E, 413F, respectively, and the modified correction gates 413D, 4138, 413F have been associated with the (k+1)-th cycle of the quantum-logic circuit. By commuting the initial correction gates 413A, 413B, 413C through the "hard" gates 410, the initial correction gates 413A, 413B, 413C are transformed to define the modified correction gates 413D, 413E, 413F, such that the "hard" gates 410 followed by the modified correction gates 413D, 413E, 413F is logically equivalent to the initial correction gates 413A, 413B, 413C followed by the "hard" gates 410. Accordingly, the modified quantum-logic circuit 400C shown in FIG. 4C is logically equivalent to the modified quantum-logic circuit 400B shown in FIG. 4B and the bare quantum-logic circuit 400A shown in FIG. 4A.

The modified quantum-logic circuit 400D shown in FIG. 4D is the modified quantum-logic circuit 400C of FIG. 4C, where the twirling gates 412 and correction gates 413 have been combined with the adjacent single-qubit gates 404. For example, the modified single-qubit gate 404G is logically equivalent to the single-qubit gate 404A (from the initial quantum-logic gate circuit 400A) followed by the twirling gate 412A. Similarly, the modified single-qubit gate 404J is logically equivalent to the correction gate 413D followed by the single-qubit gate 404D (from the initial quantum-logic gate circuit 400A).

Accordingly, the modified quantum-logic circuit 400D shown in FIG. 4D is logically equivalent to the modified quantum-logic circuit 400C shown in FIG. 4C and the bare quantum-logic circuit 400A shown in FIG. 4A. Thus, the modified quantum-logic circuit 400D shown in FIG. 4D represents the bare quantum-logic circuit 400A shown in FIG. 4A transformed by application of the twirling gates 412 and correction gates 413 shown in FIG. 4B. Like the bare quantum-logic circuit 400A shown in FIG. 4A, each cycle in the modified quantum-logic circuit 400D includes an "easy" single-qubit gate applied to each qubit, and a set of one or more "hard" gates 410 applied to one or more qubits.

The modified quantum-logic circuit 400C in FIG. 4C can be executed by a quantum information processor with the twirling gates 412 and correction gates 413 incorporated as virtual gates, for example, with the twirling gates 412 and correction gates 413 applied to the single-qubit gates 404 as shown in FIG. 4D. The virtual twirling gates and virtual correction gates may cause the quantum information processor to execute the modified quantum-logic circuit with a lower worst-case error rate compared to executing the bare quantum-logic circuit 400A on the quantum information processor. The worst-case error rate is the error rate when the quantum-logic circuit is applied to an input state that triggers the worst performance of the quantum-logic circuit. The worst-case error rate may be computed, for example, as in Equation (2), in terms of the diamond norm, or the worst-case error rate may be computed in another manner in some cases. The virtual twirling gates and virtual correction gates may cause the quantum information processor to execute the modified quantum-logic circuit with a lower average error rate compared to executing the bare quantum-logic circuit 400A on the quantum information processor. The average error rate is the average error rate of the quantum-logic circuit applied to a set of input states. The average error rate may be computed, for example, as in Equation (1), in terms of the fidelity averaged over the set of input states, or the average error rate may be computed in another manner in some cases.

In some cases, a set of distinct quantum-logic circuits is executed by a quantum information processor to obtain a set of outcomes. Each of the distinct quantum-logic circuits can be based on the modified quantum-logic circuit 400C in FIG. 4C, with the twirling gates 412 and correction gates 413 randomized and incorporated as virtual twirling gates and virtual correction gates (as in FIG. 4D). The outcome for each of the distinct quantum-logic circuits can include a measurement of the quantum state produced by the quantum-logic circuit. Each of the outcomes may depend on the specific virtual twirling gates applied in associated quantum-logic circuit, and so the outcomes may be different for each distinct quantum-logic circuit. The outcomes can be combined (e.g., averaged) to obtain a noise-tailored outcome for the set of distinct quantum-logic circuits.

The noise-tailored quantum-logic circuit 400E shown in FIG. 4E is the modified quantum-logic circuit 400D of FIG. 4D averaged over multiple realizations of randomly selecting the virtual twirling gates. The fixed noise channel 406 and the gate-dependent noise channel 408 in each cycle are modified by the virtual twirling gates and virtual correction gates, and the modified noise affecting an execution of the k-th cycle 402E is represented as the tailored noise channel 414. The virtual twirling gates can be independently selected for each realization. In some implementations, a sufficient number of realizations can suppress the worst case close to its actual probability, which is typically low. The number of realizations can be chosen to statistically bound the probability that the average outcome obtained is within a certain threshold from the actual average outcome over all possible outcomes.

Quantum computers are poised to radically outperform their classical counterparts by manipulating coherent quantum systems. A realistic quantum computer will experience errors due to the environment and imperfect control. When these errors are even partially coherent, they present a major obstacle to performing robust computations. Here, we propose a method for introducing independent random single-qubit gates into the logical circuit in such a way that the effective logical circuit remains unchanged. We prove that this randomization tailors the noise into stochastic Pauli errors, which can dramatically reduce error rates while introducing little or no experimental overhead. Moreover, we prove that our technique is robust to the inevitable variation in errors over the randomizing gates and numerically illustrate the dramatic reductions in worst-case error that are achievable. Given such tailored noise, gates with significantly lower fidelity—comparable to fidelities realized in current experiments—are sufficient to achieve fault-tolerant quantum computation. Furthermore, the worst-case error rate of the tailored noise can be directly and efficiently measured through randomized benchmarking protocols, enabling a rigorous certification of the performance of a quantum computer.

The rich complexity of quantum states and processes enables powerful new protocols for processing and communicating quantum information, as illustrated by Shor's factoring algorithm and quantum simulation algorithms. However, the same rich complexity of quantum processes that makes them useful also allows a large variety of errors to occur. Errors in a quantum computer arise from a variety of sources, including decoherence and imperfect control, where the latter generally lead to coherent (unitary) errors. It is provable possible to perform a fault-tolerant quantum computation in the presence of such errors provided they occur with at most some maximum threshold probability. However, the fault-tolerant threshold probability depends upon the error-correcting code and is notoriously difficult to estimate or bound because of the sheer variety of possible errors. Rigorous lower bounds on the threshold of the order of $10^{-6}$ for generic local noise and $10^{-4}$ and $10^{-3}$ for stochastic Pauli noise have been obtained for a variety of codes. While these bounds are rigorous, they are far below numerical estimates that range from $10^{-2}$ and $10^{-1}$, which are generally obtained assuming stochastic Pauli noise, largely because the effect of other errors is too difficult to simulate. While a threshold for Pauli errors implies a threshold exists for arbitrary errors (e.g., unitary errors), there is currently no known way to rigorously estimate a threshold for general noise from a threshold for Pauli noise.

The "error rate" due to an arbitrary noise map ε can be quantified in a variety of ways. Two particularly important quantities are the average error rate defined via the gate fidelity $$r(\varepsilon) = 1 - \int d\psi \langle \psi | \varepsilon(|\psi\rangle\langle\psi|) |\psi\rangle \tag{1}$$

and the worst-case error rate (also known as the diamond distance from the identity)

$$\epsilon(\varepsilon) = \frac{1}{2}\|\varepsilon - I\|_\diamond = \sup_\psi \frac{1}{2}\|[\varepsilon \otimes I_d - I_{d^2}](\psi)\|_1 \tag{2}$$

where d is the dimension of the system ε acts on, $\|A\|_1 = \sqrt{TrA^\dagger A}$ and the maximization is over all $d^2$-dimensional pure states (to account for the error introduced when acting on entangled states). The average error rate r(ε) is an experimentally-convenient characterization of the error rate because it can be efficiently estimated via randomized benchmarking. However, the diamond distance is typically the quantity used to prove rigorous fault-tolerance thresholds. The average error rate and the worst-case error rate are related via the bounds $$r(\varepsilon)d^{-1}(d+1) \leq \epsilon(\varepsilon) \leq \sqrt{r(\varepsilon)}\sqrt{d(d+1)}. \tag{3}$$

The lower bound is saturated by any stochastic Pauli noise, in which case the worst-case error rate is effectively equivalent to the experimental estimates obtained efficiently via randomized benchmarking. While the upper bound is not known to be tight, there exist unitary channels such that $\in(\varepsilon) \approx \sqrt{(d+1)r(\varepsilon)/4}$, so the scaling with r is optimal.

The scaling of the upper bound of equation (3) is only saturated by purely unitary noise. However, even a small coherent error relative to stochastic errors can result in a dramatic increase in the worst-case error. For example, consider a single qubit noise channel with $r=1\times10^{-4}$, where the contribution due to stochastic noise processes is $r=0.83\times10^{-4}$ and the remaining contribution is from a small unitary (coherent) rotation error. The worst-case error for such noise is $\in \approx 10^{-2}$, essentially two orders of magnitude greater than the infidelity.

Here we show that by compiling random single-qubit, gates into a logical circuit, noise with arbitrary coherence and spatial correlations can be converted (or "tailored") into stochastic Pauli noise. We also prove that our technique is robust to gate-dependent errors which arise naturally due to imperfect gate calibration. In particular, our protocol is fully robust against arbitrary gate-dependent errors on the gates that are most difficult to implement, while imperfections in the easier gates introduces an additional error that is essentially proportional to the infidelity.

Our randomized compiling technique requires only a small (classical) overhead in the compilation cost, or, alternatively, can be implemented on the fly with fast classical control. Stochastic Pauli errors with the same average error rate r as a coherent error leads to four major advantages for quantum computation: (i) they have a substantially lower worst-case error rate, (ii) the worst-case error rate can be directly estimated efficiently and robustly via randomized benchmarking experiments, enabling a direct comparison to a threshold estimate to determine if fault-tolerant quantum computation is possible, (iii) the known fault-tolerant thresholds for Pauli errors are substantially higher than for coherent errors, and (iv) the average error rate accumulates linearly with the length of a computation for stochastic Pauli errors, whereas it can accumulate quadratically for coherent errors.

Randomizing quantum circuits has been previously proposed. However, these proposals have specific limitations that our technique circumvents. The proposal for inserting Pauli gates before and after Clifford gates is a special case of our technique when the only gates to be implemented are Clifford gates. However, this technique does not account for non-Clifford gates whereas our generalized technique does. As a large number of non-Clifford gates are required to perform useful quantum computations and are often more difficult to perform fault-tolerantly, our generalized technique should be extremely valuable in practice. Moreover, previous proposals assume that the Pauli gates are essentially perfect, whereas we prove that our technique is robust to imperfections in the Pauli gates. Additionally, a method called Pauli-Random-Error-Correction (PAREC) has been shown to eliminate static coherent errors. However, PAREC involves changing the multi-qubit gates in each step of the computation. As multi-qubit errors are currently the dominant error source in most experimental platforms and typically depend strongly on the gate to be performed, it is unclear how robust PAREC will be against gate-dependent errors on multi-qubit gates and consequently against realistic noise. By way of contrast, our technique is completely robust against arbitrary gate-dependent errors on multi-qubit gates.

We begin by proposing a standardized form for compiled quantum circuits based on an operational distinction between 'easy' and 'hard' gates, that is gates that can be implemented in a given experimental platform with relatively small and large amounts of noise respectively. We also propose a specific choice of easy and 'hard' gates that is well-suited to many architectures for fault-tolerant quantum computation.

In order to experimentally implement a quantum algorithm, a quantum circuit is compiled into a sequence of elementary gates that can be directly implemented or have been specifically optimized. Typically, these elementary gates can be divided into easy and hard gate sets based either on how many physical qubits they act on or how they are implemented within a fault-tolerant architecture. In near-term applications of universal quantum computation without quantum error correction, such as quantum simulation, the physical error model and error rate associated with multi-qubit gates will generally be distinct from, and much worse than, those associated with single qubit gates. In the long-term, fault-tolerant quantum computers will implement some operations either transversally (that is, by applying independent operations to a set of physical qubits) or locally in order to prevent errors from cascading. However, recent 'no-go' theorems establish that for any fault-tolerant scheme, there exist some operations that cannot be performed in such a manner and so must be implemented via other means, such as magic-state injection or gauge fixing.

The canonical division that we consider is to set the easy gates to be the group generated by Pauli gates and the phase gate $R=|0\rangle\langle 0|+i|1\rangle\langle 1|$, and the hard gate set to be the Hardamard gate H, the $\pi/8$ gate $\sqrt{R}$ and the two-qubit controlled-Z gate $\Delta(Z)=|0\rangle\langle 0|\otimes I+|0\rangle\langle 0|\otimes Z$. Such circuits are universal for quantum computation and naturally suit many fault-tolerant settings, including CSS codes with a transversal T gate (such as the 15-qubit Reed-Muller code), color codes and the surface code. While some of the 'hard' gates may be easier than others in a given implementation, it is beneficial to make the set of easy gates as small as possible since our scheme is completely robust to arbitrary variations in errors over the hard gates.

With such a division of the gates, the target circuit can be reorganized into a circuit (the 'bare' circuit) consisting of K clock cycles, wherein each cycle consists of a round of easy gates followed by a round of hard gates applied to disjoint qubits as in FIG. 3a. To concisely represent the composite operations performed in individual rounds, we use the notational shorthand $\vec{A}=A_1\otimes \ldots \otimes A_n$ and define $G_k$ to be the product of all the hard gates applied in the kill cycle. We also set $G_K=I$ without loss of generality, so that the circuit begins and ends with a round of easy gates.

We now specify how standardized circuits in the above form can be randomized in order to average errors in the implementations of the elementary gates into an effective stochastic channel, that is, into a channel $\varepsilon$ that maps any n-qudit state $\rho$ to $$\varepsilon(\rho) = \sum_{P \in P_d^{\otimes n}} c_P P \rho P^{\dagger}, \quad (4)$$

where $P_d^{\otimes n}$ is the set of $d^{2n}$ generalized Pauli operators and the coefficients $c_P$ are a probability distribution over $P_d^{\otimes n}$. For qubits (d=2), $P_2$ is the familiar set of four Hermitian and unitary Pauli operator $\{I, X, Y, Z\}$.

Let C denote the group generated by the easy gates and assume that it contains a subset T such that $$\varepsilon^T = \mathbb{E}_T T^{\dagger} \varepsilon T \quad (5)$$

is a stochastic channel for any channel $\varepsilon$, where $\mathbb{E}_x f(x) = |X|^{-1} \sum_{x \in X} f(x)$ denotes the uniform average over a set X (typically a gate set implicit from the context). The canonical example of such a set is $P_d^{\otimes n}$ or any group containing $P_d^{\otimes n}$.

We propose the following randomized compiling technique, where the randomization should ideally be performed independently for each run of a given bare circuit. Each round of easy gates $\vec{C}_k$ in the bare circuit of FIG. 3a is replaced with a round of randomized dressed gates $$\hat{C}_k = \vec{T}_k \vec{C}_k \vec{T}_{k-1}^c \quad (6)$$

as in FIG. 3b, where the $T_{j,k}$ are chosen uniformly at random from the twirling set T and the correction operators are set to $\vec{T}_k^c = G_k \vec{T}_k^{\dagger} G_k^{\dagger}$ to undo the randomization from the previous round. The edge terms $\vec{T}_0^c$ and $\vec{T}_K$ can either be set to the identity or also randomized depending on the choice of the twirling set and the states and measurements.

The dressed gates should then be compiled into and implemented as a single round of elementary gates as in FIG. 3c rather than being implemented as three separate rounds of elementary gates. In order to allow the dressed gates to be compiled into a single easy gate, we require $\vec{T}_k^c \in C^{\otimes n}$ for all $\vec{T}_k \in T^{\otimes n}$. The example with $T=P_d$ that has been implicitly appealed to and described as "toggling the Pauli frame" previously is a special case of the above technique when the hard gates are Clifford gates (which are defined to be the gates that map Pauli operators to Pauli operators under conjugation), but breaks down when the hard gates include non-Clifford gates such as the single-qubit π/8 gate. For the canonical division into easy and hard gates from the previous section, we set T=$P_2$, C to be the group generated by R and $P_2$ (which is isomorphic to the dihedral group of order 8) and the hard gates to be rounds of H, √R and Δ(Z) gates. Conjugating a Pauli gate by H or Δ(Z) maps it to another Pauli gate, while conjugating by √R maps $X^xZ^z$ to $R^xX^xZ^z$ (up to a global phase). Therefore the correction gates, and hence the dressed gates, are all elements of the easy gate set.

The tailored noise is not realized in any individual choice of sequences. Rather, it is the average over independent random sequences. However, while each term $T^†εT$ in the tailored noise can have a different effect on an input state ρ, if the twirling gates are independently chosen on each run, then the expected noise over multiple runs is exactly the tailored noise. Independently sampling the twirling gates each time the circuit is run introduces some additional overhead, since the dressed gates (which are physically implemented) depend on the twirling gates and so need to be recompiled for each experimental run of a logical circuit. However, this recompilation can be performed in advance efficiently on a classical computer or else applied efficiently 'on the fly' with fast classical control. Moreover, this fast classical control is exactly equivalent to the control required in quantum error correction so imposes no additional experimental burden.

We will prove below that our technique tailors noise satisfying various technical assumptions into stochastic Pauli noise. We expect the technique will also tailor more general noise into approximately stochastic noise, though leave a fully general proof as an open problem.

We now prove that our randomized compiling scheme results it) an average stochastic noise channel for Markovian noise that depends arbitrarily upon the hard gates but is independent of the easy gate. Under this assumption, the noisy implementations of the kth round of easy gates $\vec{C}_k$ and hard gates $G_k$ can be written as $ε_e\vec{C}$ and $G_kε(G_k)$ respectively, where $ε_e$ and $ε(G_k)$ are n-qubit channels that can include multi-qubit correlations and ε(*) can depend arbitrarily on the argument, that is, on which hard gates are implemented.

Theorem 1. Randomly sampling the twirling gates $\vec{T}_k$ independently in each round tailors the noise at each time step (except the last) into stochastic Pauli noise when the noise on the easy gates is gate-independent.

Proof. The key observation is that if the noise in rounds of easy gates is some fixed noise channel $ε_e$, then the dressed gates in equation (6) have the same noise as the bare gates and so compiling in the extra twirling gates in FIG. 4c does not change the noise at each time step, as illustrated in FIG. 4a and 4d. Furthermore, the correction gates $T_{k,j}^c$ are chosen so that they are the inverse of the randomizing gates when they are commuted through the hard gates, as illustrated in FIG. 4b and 4c. Consequently, uniformly averaging over the twirling gates in every cycle reduces the noise in the kth cycle to the tailored noise $$\mathcal{T}_k = \mathbb{E}_{\vec{T}} \vec{T}^† ε(G_k) ε_e \vec{T} \quad (7)$$

where for channels $\mathcal{A}$ and $\mathcal{B}$, $\mathcal{AB}$ denotes the channel whose action on a matrix M is $\mathcal{A}(\mathcal{B}(M))$. When T=P, the above channel is a Pauli channel. Moreover, by the definition of a unitary 1-design, the above sum is independent of the choice of T and so is a Pauli channel for any unitary 1-design.

Theorem 1 establishes that the noise in all but the final cycle can be exactly tailored into stochastic noise (albeit under somewhat idealized conditions which will be relaxed below). To account for noise in the final round, we can write the effect corresponding to a measurement outcome $|\vec{z}\rangle$ as $\mathcal{A}(|\vec{z}\rangle\langle\vec{z}|)$ for some fixed noise map $\mathcal{A}$. If P⊂C, we can choose $\vec{T}_K$ uniformly at random from $\mathbb{P}^{⊗n}$. A virtual Pauli gate can then be inserted between the noise map $\mathcal{A}$ and the idealized measurement effect $|\vec{z}\rangle\langle\vec{z}|$ by classically relabeling the measurement outcomes to map $\vec{z} \to \vec{z}⊕\vec{x}$, where ⊕ denotes entry-wise addition modulo two. Averaging over $\vec{T}_K$ with this relabeling reduces the noise in the final round of single-qubit Clifford gates and the measurement to $$\tilde{\mathcal{A}} = \mathbb{E}_{\vec{P}} \vec{P} \mathcal{A} ε_e \vec{P} \quad (8)$$

This technique can also be applied to quantum non-demolition measurements on a subset of the qubits (as in, for example, error-correcting circuits), where the unmeasured qubits have randomizing twirling gates applied before and after the measurement.

By theorem 1, our technique is fully robust to the most important form of gate-dependence, namely, gate-dependent errors on the hard gates. However, theorem 1 still requires that the noise on the easy gates is effectively gate-independent. Because residual control errors in the easy gates will generally produce small gate-dependent (coherent) errors, we will show that the benefits of noise tailoring can still be achieved in this physically realistic setting.

When the noise depends on the easy gates, the tailored noise in the kth cycle from equation (7) becomes $$\tilde{\mathcal{T}}_k^{GD} = \mathbb{E}_{\vec{T}_1,\ldots,\vec{T}_k} \vec{T}_k^† ε(G_k) ε(\vec{\tilde{C}}_k) \vec{T}_k, \quad (9)$$

which depends on the previous twirling gates through $\tilde{\vec{C}}_k$ by equation (6). This dependence means that we cannot assign independent noise to each cycle in the tailored circuit.

However, in theorem 2 (proven in 'Methods') we show that implementing a circuit with gate-dependent noise $ε(\vec{\tilde{C}}_k)$ instead of the corresponding gate-independent noise $$ε_k^T = \mathbb{E}_{\vec{C}_k} ε(\vec{\tilde{C}}_k) = \mathbb{E}_{\vec{T}_k,\vec{T}_{k-1}} ε(\vec{T}_k \vec{C}_k \vec{T}_{k-1}^c) \quad (10)$$

introduces a relatively small additional error. We show that the additional error is especially small when T is a group normalized by C, that is, $CTC^† ∈ T$ for all C∈C, T∈T. This condition is satisfied in many practical cases, including the scenario where T is the Pauli group and C is the group generated by Pauli and R gates. The stronger bound reduces the contributions from every cycle by orders of magnitude in parameter regimes of interest (i.e., $∈[ε(G_{k-1})ε_{k-1}^T] ≤ 10^{-2}$, comparable to current experiments), so that the bound on the additional error grows very slowly with the circuit length.

Theorem 2. Let $\mathcal{C}_{GD}$ and $\mathcal{C}_{GI}$ be tailored circuits with gate-dependent and gate-independent noise on the easy gates respectively. Then $$\|C_{GD} - C_{GI}\|_\diamond \le \sum_{k=1}^{K} E_{\vec{T}_1,\ldots,\vec{T}_K} \|\varepsilon(\vec{C}_k) - \varepsilon_k^T\|_\diamond. \quad (11)$$

When T is a group normalized by C, this can be improved to $$\|C_{GD} - C_{GI}\|_\diamond \le \quad (12)$$

$$\sum_{k=2}^{K} 2\mathbb{E}_{\vec{C}_k} \|\varepsilon(\vec{C}_k) - \varepsilon_k^T\|_\diamond \|\varepsilon[\varepsilon(G_{k-1})\varepsilon_{k-1}^T]\|_\diamond + \mathbb{E}_{\vec{C}_1} \|\varepsilon(\vec{C}_1) - \varepsilon_1^T\|_\diamond.$$

Proof. Let $$\mathcal{A}_k = G_k \varepsilon(G_k) \varepsilon(\vec{C}_k) \vec{C}_k$$

$$\mathcal{B}_k = G_k \varepsilon(G_k) \varepsilon_k^T \vec{C}_k, \quad (13)$$

where $\mathcal{A}_k$ and $\mathcal{B}_k$ implicitly depend on the choice of twirling gates. Then the tailored circuits under gate-dependent and gate-independent noise are $$\mathcal{C}_{GD} = \mathbb{E}_a \mathcal{A}_{K:1}$$

$$\mathcal{C}_{GI} = \mathbb{E}_a \mathcal{B}_{K:1}, \quad (14)$$

respectively, where $\mathcal{X}_{a:b} = \mathcal{X}_a \ldots \mathcal{X}_b$ (note that this product is non-commutative) with $\mathcal{A}_{K:K+1} = \mathcal{B}_{0:1} = \mathcal{B}$ and the expectation is over all $\vec{T}_a$ for $a = 1, \ldots, K$. Then by a straightforward induction argument, $$\mathcal{A}_{K:1} - \mathcal{B}_{K:1} = \sum_{k=1}^{K} \mathcal{A}_{K:k+1}(\mathcal{A}_k - \mathcal{B}_k)\mathcal{B}_{k-1:1} \quad (15)$$

for any fixed choice of the twirling gates. By the triangle inequality.

$$\|C_{GD} - C_{GI}\|_\diamond = \left\|\mathbb{E}_a \sum_{k=1}^{K} \mathcal{A}_{K:k+1}(\mathcal{A}_k - \mathcal{B}_k)\mathcal{B}_{k-1:1}\right\|_\diamond \quad (16)$$

$$\le \mathbb{E}_a \sum_{k=1}^{K} \|\mathcal{A}_{K:k+1}(\mathcal{A}_k - \mathcal{B}_k)\mathcal{B}_{k-1:1}\|_\diamond$$

$$\le \mathbb{E}_a \sum_{k=1}^{K} \|\varepsilon(\vec{C}_k) - \varepsilon_k^T\|_\diamond,$$

where the second inequality follows from the submultiplicativity $$\|\mathcal{A}\mathcal{B}\|_\diamond \le \|\mathcal{A}\|_\diamond \|\mathcal{B}\|_\diamond \quad (17)$$

of the diamond norm and the normalization $\|\mathcal{A}\|_\diamond = 1$ which holds for all quantum channels $\mathcal{A}$.

We can substantially improve the above bound by evaluating some of the averages over twirling gates before applying the triangle inequality. In particular, leaving the average over $\vec{T}_{k-1}$ inside the diamond norm in equation (16) for every term except $k=1$ gives $$\|C_{GD} - C_{GI}\|_\diamond \le \sum_{k=1}^{K} \mathbb{E}_{a \ne k-1} \|\mathbb{E}_{k-1} \delta_k \gamma_k\|_\diamond + \mathbb{E}_a \|\varepsilon(\vec{C}_1) - \varepsilon_1^T\|_\diamond, \quad (18)$$

where $$\delta_k = \varepsilon(\vec{C}_k) - \varepsilon_k^T \quad (19)$$

$$\gamma_k = \vec{C}_k G_{k-1} \varepsilon(G_{k-1}) \varepsilon_{k-1}^T \vec{T}_{k-1},$$

and $\delta_k \gamma_k$ is the only factor of $\mathcal{A}_{K:k+1}(\mathcal{A}_k - \mathcal{B}_k)\mathcal{B}_{k-1:1}$ that depends on $\vec{T}_{k-1}$. Substituting $\varepsilon(G_{k-1})\varepsilon_{k-1}^T = (\varepsilon(G_{k-1})\varepsilon_{k-1}^T - \mathcal{I}) + \mathcal{I}$ in $\gamma_k$ gives $$\mathbb{E}_{k-1} \delta_k = \mathbb{E}_{k-1} \delta_k \vec{C}_k G_{k-1}[(\varepsilon(G_{k-1})\varepsilon_{k-1}^T - \mathcal{I})] \vec{T}_{k-1}$$

$$+ \mathbb{E}_{k-1} \delta_k \vec{T}_k \vec{C}_k G_{k-1}, \quad (20)$$

where the only factor in the second term that depends on $\vec{T}_{k-1}$ is $\delta_k$. When T is a group normalized by C, $$\mathbb{E}_{k-1} \delta_k = \mathbb{E}_{k-1} \varepsilon(\vec{C}_k) - \varepsilon_k^T \quad (21)$$

$$= \mathbb{E}_{k-1} \varepsilon(\vec{C}_k [\vec{C}_k^\dagger \vec{T}_k \vec{C}_k]^c) \vec{T}_{k-1}) - \varepsilon_k^T$$

$$= \mathbb{E}_{\vec{T}'} \varepsilon(\vec{C}_k \vec{T}') - \varepsilon_k^T$$

$$= 0$$

for any fixed value of $\vec{T}_k$, using the fact that $\{hg : g \in G\} = G$ for any group G and $h \in G$ and that $\mathbb{E}_{\vec{T}'} \varepsilon(\vec{C}_k \vec{T}')$ is independent of $\vec{T}_k$. Therefore $$\|C_{GD} - C_{GI}\|_\diamond = \|\mathbb{E}_j(\mathcal{A}_{K:1} - \mathcal{B}_{K:1})\|_\diamond \quad (22)$$

$$\le \|\delta_1\|_\diamond + \sum_{k=2}^{K} \mathbb{E}_{j \ne k-1} \|\mathbb{E}_{k-1} \delta_k \gamma_k\|_\diamond$$

$$\le \|\delta_1\|_\diamond + \sum_{k=2}^{K} \mathbb{E}_{j \ne k-1} \left\|\mathbb{E}_{\vec{T}_{k-1}} \delta_k \vec{C}\right.$$

$$\left. _k \times G_{k-1}[\varepsilon(G_{k-1})\varepsilon_{k-1}^T - \mathcal{I}] \vec{T}_{k-1}\right\|_\diamond$$

$$\le \sum_{k=2}^{K} \mathbb{E}_j \|\delta_k\|_\diamond \|\varepsilon(G_{k-1})\varepsilon_{k-1}^T - \mathcal{I}\|_\diamond +$$

$$\|\delta_1\|_\diamond,$$

where we have had to split the sum over k as $\vec{T}_0$ is fixed to the identity. □

There are two particularly important scenarios in which the effect of gate-dependent contributions need to be considered and which determine the physically relevant value of K. In near-term applications such as quantum simulators, the following theorem would be applied to the entire circuit, while in long-term applications with quantum error correction, the following theorem would be applied to fragments corresponding to rounds of error correction. Hence under our randomized compiling technique, the noise on the easy gates imposes a limit either on the useful length of a circuit without error correction or on the distance between rounds of error correction. It is important to note that a practical limit on K is already imposed, in the absence of our technique, by the simple fact that even Pauli noise accumulates linearly in time, so $r(\tilde{\mathcal{T}}_k) \ll 1/K$ is already required to ensure that the output of any realistic circuit remains close to the ideal circuit.

Figure 5:
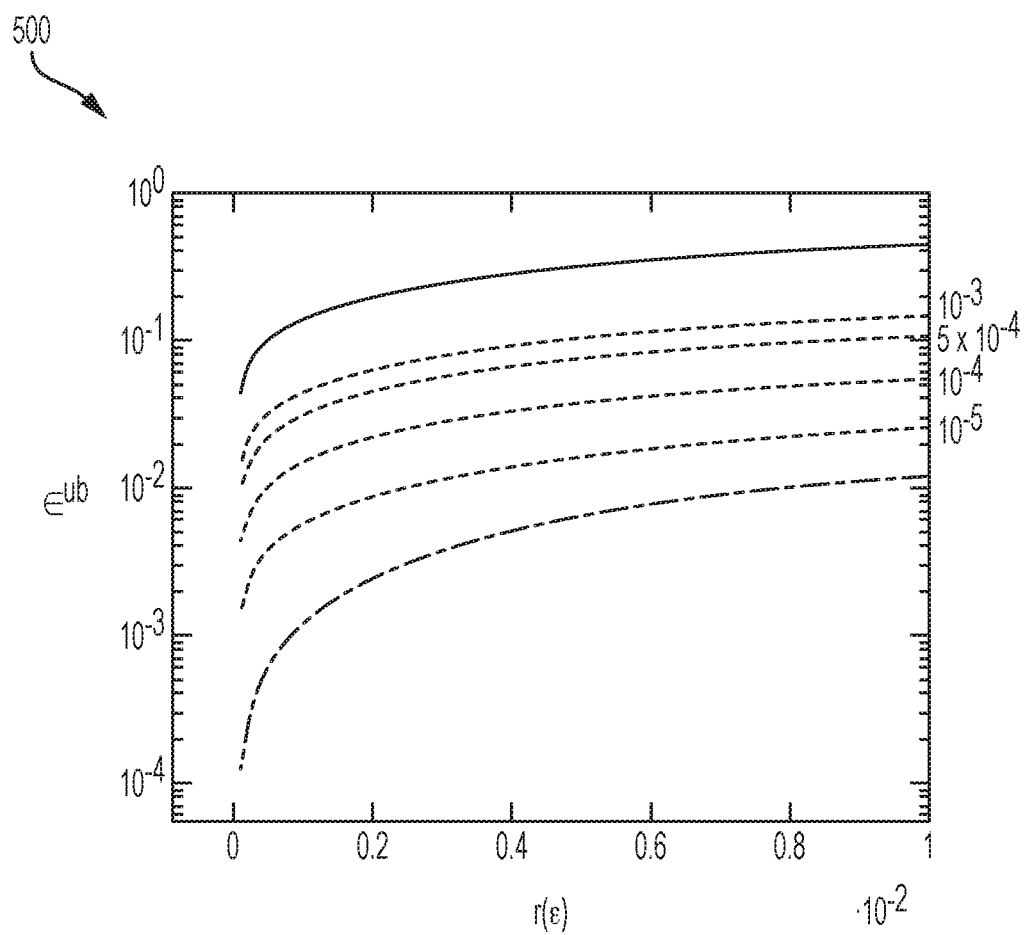
FIG. 5 is a plot showing an upper bound on worst-case errors in simulated executions of an example quantum-logic circuit.

While theorem 2 provides a very promising bound, it is unclear how to estimate the quantities $$\frac{1}{2}\mathbb{E}_{\vec{C}_k}\left\|\epsilon(\vec{C}_k) - \epsilon_k^T\right\|_\diamond$$

without performing full process tomography. To remedy this, we now provide the following bound in terms of the infidelity, which can be efficiently estimated via randomized benchmarking. We expect the following bound is not tight as we use the triangle inequality to turn the deviation from the average noise into deviations from no noise, which should be substantially larger. However, even the following loose bound is sufficient to rigorously guarantee that our technique significantly reduces the worst-case error, as illustrated in FIG. 5 for a two-qubit, gate in the bulk of a circuit (i.e., with k>1).

The following bound could also be substantially improved if the noise on the easy gates is known to be close to depolarizing (even if the hard gates have strongly coherent errors), as quantified by the unitarity. However, rigorously determining an improved bound would require analyzing the protocol for estimating the unitarity under gate-dependent noise, which is currently an open problem.

Theorem 3. For arbitrary noise.

$$\mathbb{E}_{\vec{C}_k}\|\epsilon(\vec{C}_k) - \epsilon_k^T\|_\diamond \leq 2\epsilon(\epsilon_k^T) + 2\sqrt{\mathbb{E}_{\vec{C}_k}\epsilon[\epsilon(\tilde{\vec{C}}_k)]^2}. \quad (23)$$

For n-qubit circuits with local noise on the easy gates, $$\mathbb{E}_{\vec{C}_k}\left\|\epsilon(\vec{C}_k) - \epsilon_k^T\right\|_\diamond \leq \sum_{j=1}^{n} 4\sqrt{6r(\epsilon_{j,k}^T)} \quad (24)$$

for k=2, ..., K, where $\epsilon_{j,k}^T = \mathbb{E}_{\tilde{C}_{j,k}}\epsilon_j(\tilde{C}_{j,k})$ is the local noise on the jth qubit, averaged over the dressed gates in the kth cycle.

Proof. First note that, by the triangle inequality, $$\mathbb{E}_{\vec{C}_k}\left\|\epsilon(\vec{C}_k) - \epsilon_k^T\right\|_\diamond = \mathbb{E}_{\vec{C}_k}\left\|\epsilon(\vec{C}_k) - \mathcal{I} + \mathcal{I} - \epsilon_k^T\right\|_\diamond \quad (25)$$

$$\leq \mathbb{E}_{\vec{C}_k}\left\|\epsilon(\vec{C}_k) - \mathcal{I}\right\|_\diamond + \|\mathcal{I} - \epsilon_k^T\|_\diamond$$

$$\leq \mathbb{E}_{\vec{C}_k} 2\epsilon\left[\epsilon(\vec{C}_k)\right] + 2\epsilon(\epsilon_k^T).$$

By the Cauchy-Schwarz inequality, $$\left(\mathbb{E}_{\vec{C}_k}\epsilon\left[\epsilon(\vec{C}_k)\right]\right)^2 = \left(\sum_{\vec{C}_k}\left|\#\vec{C}_k\right|^{-1}\epsilon\left[\epsilon(\vec{C}_k)\right]\right)^2 \quad (26)$$

$$\leq \left(\sum_{\vec{C}_k}\left|\#\vec{C}_k\right|^{-2}\right)\left(\sum_{\vec{C}_k}\epsilon\left[\epsilon(\vec{C}_k)\right]^2\right)$$

$$\leq \left|\#\vec{C}_k\right|^{-1}\left(\sum_{\vec{C}_k}\epsilon\left[\epsilon(\vec{C}_k)\right]^2\right)$$

$$= \mathbb{E}_{\vec{C}_k}\epsilon\left[\epsilon(\vec{C}_k)\right]^2,$$

where $\#\tilde{\vec{C}}_k$ is the number of different dressed gates in the kth round.

For local noise, that is, noise of the form $\epsilon_1 \otimes \ldots \epsilon_n$ where $\epsilon_j$ is the noise on the jth qubit, $$\epsilon\left[\epsilon(\tilde{\vec{C}}_k)\right] = \frac{1}{2}\left\|\bigotimes_{j=1}^{n}\epsilon_j(\tilde{C}_{j,k}) - \mathcal{I}\right\|_\diamond \quad (27)$$

$$\leq \sum_{j=1}^{n}\frac{1}{2}\|\epsilon_j(\tilde{C}_{j,k}) - \mathcal{I}\|_\diamond$$

$$\leq \sum_{j=1}^{n}\epsilon[\epsilon(\tilde{C}_{j,k})],$$

where we have used the analog of equation (15) for the tensor product and $$\|A \otimes B\|_\diamond \leq \|A\|_\diamond \|B\|_\diamond, \quad (28)$$

which holds for all A and B due to the submultiplicativity of the diamond norm, and the equality $\|A \otimes \mathcal{I}\|_\diamond = \|A\|_\diamond$. Similarly, $$\epsilon(\epsilon_k^T) = \sum_{j=1}^{n}\epsilon(\epsilon_{j,k}^T) \quad (29)$$

where $\epsilon_{j,k}^T = \mathbb{E}_{T_{j,k-1}, T_{j,k}}\epsilon(\tilde{C}_{j,k})$. We then have $$\mathbb{E}_{\vec{C}_k}\epsilon\left[\epsilon(\vec{C}_k)\right] \leq \sum_{j=1}^{n}\mathbb{E}_{\tilde{C}_{j,k}}\epsilon\left[\epsilon(\tilde{C}_{j,k})\right] \quad (30)$$

$$\leq \sum_{j=1}^{n}\sqrt{\mathbb{E}_{\tilde{C}_{j,k}}\epsilon\left[\epsilon(\tilde{C}_{j,k})\right]^2}$$

where the second inequality is due to the Cauchy-Schwarz inequality as in equation (26). Returning to equation (25), we have $$\mathbb{E}_{\vec{C}_k}\left\|\epsilon(\vec{C}_k) - \epsilon_k^T\right\|_\diamond \leq \sum_{j=1}^{n}2\epsilon(\epsilon_{j,k}^T) + 2\sqrt{\mathbb{E}_{\tilde{C}_{j,k}}\epsilon\left[\epsilon(\tilde{C}_{j,k})\right]^2} \quad (31)$$

$$\leq \sum_{j=1}^{n}2\sqrt{6r(\epsilon_{j,k}^T)} + 2\sqrt{\mathbb{E}_{\tilde{C}_{j,k}}6r[\epsilon(\tilde{C}_{j,k})]}$$

$$\leq \sum_{j=1}^{n}4\sqrt{6r(\epsilon_{j,k}^T)}$$

for local noise, where the second inequality follows from equation (3) with d=2 and the third from the linearity of the infidelity. □

Tailoring experimental noise into stochastic noise via our technique provides several dramatic advantage, which we now illustrate via numerical simulations. Our simulations are all of six-qubit circuits with the canonical division into easy and hard gates. That is, the easy gates are composed of Pauli gates and the phase gate R=|0⟩⟨0|+i|1⟩⟨1|, while the hard gates are the Hadamard, π/8 gate T=√R and the two-qubit controlled-Z gate Δ(Z)=|0⟩⟨0|⊗I+|1⟩⟨1|⊗Z. Such circuits are universal for quantum computation and naturally suit many fault-tolerant, settings, including CSS codes with a transversal T gate (such as the 15-qubit Reed-Muller code), color codes and the surface code.

We quantify the total noise in a noisy implementation $C_{noisy}$ of an ideal circuit $C_{id}$ by the variational distance $$\tau_{noisy} = \sum_j \frac{1}{2} |Pr(j|C_{noisy}) - Pr(j|C_{id})| \quad (32)$$

between the probability distributions for ideal computational basis measurements after applying $C_{noisy}$ and $C_{id}$ to a system initialized in the $|0\rangle^{\otimes n}$ state. We do not maximize over states and measurements, rather, our results indicate the effect of noise under practical choices of preparations and measurements.

For our numerical simulations, we add gate-dependent over-rotations to each gate, that is, we perturb one of the eigenvectors of each gate U by $e^{i\delta_U}$. For single-qubit gates, the choice of eigenvector is irrelevant (up to a global phase), while for the two-qubit Δ(Z) gate, we add the phase to the |11⟩ state.

Figure 7:
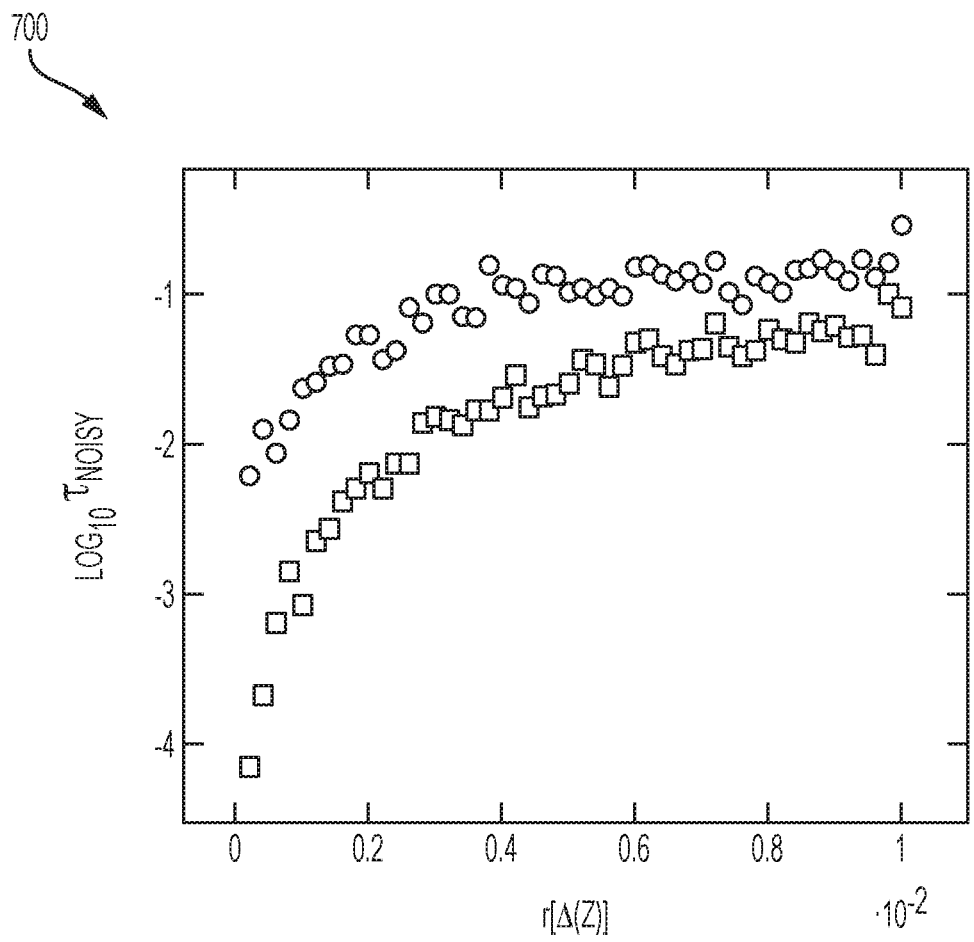
FIG. 7 is a plot showing errors in simulated executions of an example quantum-logic circuit.

We perform two sets of numerical simulations to illustrate two particular properties. First, FIG. 7 shows that our technique introduces a larger relative improvement as the infidelity decreases, that is, approximately a factor of two on a log scale, directly analogous to the r/√r scaling for the worst case error (although recall that our simulations are for computational basis states and measurements and do not maximize the error over preparations and measurements). For these simulations, we set $\delta_U$ so that the Δ(Z) gate has an infidelity of r[Δ(Z)] and so that all single-qubit gates have an infidelity of r[Δ(Z)]/10 (regardless of whether they are included in the "easy" or the "hard" set). For the bare circuits (blue circles), each data point is the variational distance of a randomly-chosen six-qubit circuit with a hundred alternating rounds of easy and hard gates, each sampled uniformly from the sets of all possible easy and hard gate rounds respectively. For the tailored circuits (red squares), each data point is the variational distance between $Pr(j|C_{id})$ and the probability distribution $Pr(j|C_{noisy})$ averaged over $10^3$ randomizations of the bare circuit obtained by replacing the easy gates with (compiled) dressed gates as in equation (6).

Figure 6:
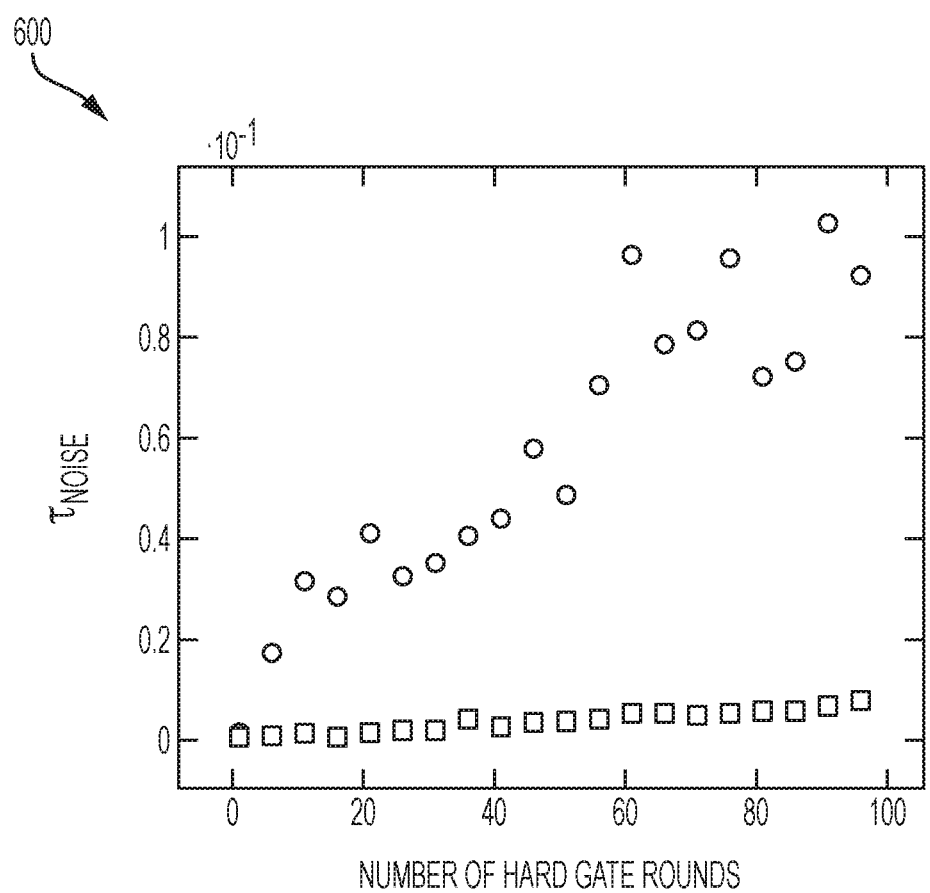
FIG. 6 is a plot showing errors in simulated executions of an example quantum-logic circuit.

Second, FIG. 6 shows that the typical error for both the bare and tailored circuits grows approximately linearly with the length of the circuit. This suggests that, for typical circuits, the primary reason that the total error is reduced by our technique is not because it prevents the worst-case quadratic accumulation of fidelity with the circuit length (although it does achieve this). Rather, the total error is reduced because the contribution from each error location is reduced, where the number of error locations grows linearly with the circuit size. For these simulations, we set $\delta_U$ so that the Δ(Z) gate has an infidelity of $10^{-3}$ and the easy gates have infidelities of $10^{-5}$. For the bare circuits (blue circles), each data point is the variational distance of a randomly-chosen six-qubit circuit as above with K alternating rounds of easy and hard gates, where K varies from five to a hundred. The tailored circuits (red squares) again give the variational distance between the ideal distribution and the probability distribution averaged over $10^3$ randomizations of the bare circuit.

We have shown that arbitrary Markovian noise processes can be reduced to effective Pauli processes by compiling different sets of uniformly random gates into sequential operations. This randomized compiling technique can reduce the worst-case error rate by orders of magnitude and enables threshold estimates for general noise models to be obtained directly from threshold estimates for Pauli noise. Physical implementations can then be evaluated by directly comparing these threshold estimates to the average error rate r estimated via efficient experimental techniques, such as randomized benchmarking, to determine whether the experimental implementation has reached the fault-tolerant regime. More specifically, the average error rate r is that of the tailored channel for the composite noise on a round of easy and hard gates and this can be directly estimated using interleaved randomized benchmarking with the relevant choice of group.

Our technique can be applied directly to gate sets that are universal for quantum computation, including all elements in a large class of fault-tolerant proposals. Moreover, our technique only requires local gates to tailor general noise on multi-qubit gates into Pauli noise. Our numerical simulations in FIG. 6 and FIG. 7 demonstrate that our technique can reduce worst-case errors by orders of magnitude. Furthermore, our scheme should generally produce an even greater effect as fault-tolerant protocols are scaled up, since fault-tolerant protocols are designed to suppress errors, for example, $\epsilon \to \epsilon^k$ for some scale factor k (e.g., number of levels of concatenation), so any reduction at the physical level is improved exponentially with k. However, while the technique can be directly integrated into fault-tolerant implementations, analyzing the impact on encoded error rates remains an open problem and will generally depend on the specific noise and error-correcting code.

A particularly significant open problem is the robustness of our technique to noise that remains non-Markovian on a time-scale longer than a typical gate time. Non-Markovian noise can be mitigated by techniques such as randomized dynamic decoupling, which correspond to applying random sequences of Pauli operators to echo out non-Markovian contributions. Due to the random gates compiled in at each time step, we expect that our technique may also suppress non-Markovian noise in a similar manner.

FIG. 5 is a plot 500 showing an upper bound on worst-case errors in simulated executions of an example two-qubit quantum logic gate (e.g., a controlled-not gate) as a function of the infidelity r(ε) of the two-qubit quantum logic gate. The plot 500 in FIG. 5 is shown on a semi-log scale. The plot 500 includes a horizontal axis representing the infidelity r(ε), and the plot 500 includes a vertical axis representing the upper bounds $\epsilon^{ub}$ on the worst case error. The solid line in the plot 500 represents simulations where the bare quantum-logic process is executed without noise-tailoring. The dashed lines in the plot 500 represent simulations where gate-dependent noise is tailored by application of virtual random gates, with simulations for four values ($10^{-3}$, $5\times10^{-4}$, $10^{-4}$, $10^{-5}$, as indicated in the plot 500) of the quantity $r(\bar{\epsilon}_{j,k}^T)$. For comparison, the chained line in the plot 500 represents simulations where gate-independent noise is tailored by application of virtual random gates.

FIG. 6 is a plot showing errors in simulated executions of an example quantum-logic circuit. The plot 600 includes a horizontal axis representing the number of hard gate rounds, and the plot 600 includes a vertical axis representing the error $\tau_{noise}$ computed in a classical-computer simulation of a quantum-logic process executed by an example six-qubit quantum information processor, averaged over $10^3$ realizations.

The error $\tau_{noise}$ shown in the plot 600 is from Equation (32), and is plotted with respect to computational basis measurement outcomes as a function of the average gate error $r[\Delta(Z)]$ of the noise on the $\Delta(Z)$ gate in six-qubit bare (blue circles) and tailored (red squares) circuits. Each data point in the plot 600 corresponds to an independent random circuit with K cycles, where the (gate dependent) noise on each gate is an over-rotation about the relevant eigenbasis with infidelity $10^{-3}$ for the $\Delta(Z)$ gates and $10^{-5}$ for all single-qubit gates. The data points for the tailored noise correspond to an average over $10^3$ independent randomizations of the corresponding bare circuit via Equation (6). As shown in the plot 600, the error rate grows approximately linearly with the number of gate cycles, suggesting that the dominant reason for the error suppression is that the error at each location is suppressed (where there are a linear number of total locations), rather than the suppression of possible quadratic accumulation of coherent errors between locations.

FIG. 7 is a plot 700 showing errors in simulated executions of an example quantum-logic circuit. The plot 700 in FIG. 7 is shown on a semi-log scale. The plot 700 includes a horizontal axis representing die average gate error $r[\Delta(Z)]$, and the plot 700 includes a vertical axis representing the error $\tau_{noise}$ on a logarithmic scale (log base-10) computed in a classical-computer simulation of a quantum-logic process executed by an example six-qubit quantum information processor, averaged over $10^3$ independent realizations.

The error $\tau_{noise}$ shown in the plot 700 is from Equation (32), and is plotted with respect to computational basis measurement outcomes as a function of the average gate error $r[\Delta(Z)]$ of the noise on the $\Delta(Z)$ gate in six-qubit bare (blue circles) and tailored (red squares) circuits. Each data point in the plot 700 corresponds to an independent random circuit with 100 cycles, where the (gate dependent) noise on each gate is an over-rotation about the relevant eigenbasis with infidelity $r[\Delta(Z)]$ for the $\Delta(Z)$ gates and $r[\Delta(Z)]/10$ for all single-qubit gates. The data points for the tailored noise correspond to an average over $10^3$ independent randomizations of the corresponding bare circuit via Equation (6). As shown in the plot 600, the total error for the bare and tailored circuits differs by a factor of approximately 2 on a log scale, mirroring the separation between the worst-case errors for stochastic and unitary channels from Equation (3), although here the error is not maximized over preparations and measurements.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. A computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks, in some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

In a first example, an initial quantum-logic gate sequence is received. A modified quantum-logic gate sequence is generated by applying virtual random gates to the initial quantum-logic gate sequence, such that the initial quantum-logic gate sequence is logically equivalent to the modified quantum-logic gate sequence. The modified quantum-logic gate sequence can be provided to a quantum information processor for execution.

In a second example, a system includes a quantum information processor and one or more data processors. The data processors are configured to receive an initial quantum-logic gate sequence; generate a modified quantum-logic gate sequence by applying virtual random gates to the initial quantum-logic gale sequence; and providing the modified quantum-logic gate to be executed by the quantum information processor. The initial quantum-logic gate sequence is logically equivalent to the modified quantum-logic gate sequence.

Implementations of the first or second example may include one or more of the following features. The initial quantum-logic gate sequence can include a series of cycles, and the modified quantum-logic gate sequence can be generated by applying virtual random gates in each cycle of the initial quantum-logic gate sequence. After the initial cycle in the series, a portion of the virtual random gates applied in each cycle can be configured to invert one or more of the virtual random gates applied in the preceding cycle. The virtual random gates can include virtual random Pauli gates or dihedral gates. Providing the modified quantum-logic gate to be executed by a quantum information processor can include converting the modified quantum-logic gate into machine code that is executable by the quantum information processor. The virtual random gates can be configured to convert coherent errors in the quantum information processor into stochastic errors in the quantum information processor.

In a third example, a noise-tailoring method includes receiving a bare quantum-logic circuit; generating a set of modified quantum-logic circuits by applying virtual twirling gates and virtual correction gates to the bare quantum-logic circuit; executing the set of modified quantum-logic circuits on a quantum information processor to obtain a set of outcomes; and averaging the set of outcomes to obtain a noise-tailored outcome. The bare quantum-logic circuit is logically equivalent to each of the modified quantum-logic circuits.

Implementations of the third example may include one or more of the following features. The bare quantum-logic circuit can include multiple clock cycles, and the virtual twirling gates and virtual correction gates can be applied to each clock cycle. The virtual random gates can include virtual random Pauli gates or dihedral gates. The virtual twirling gates and virtual correction gates can cause the quantum information processor to execute the modified quantum-logic circuit with a lower worst-case error rate compared to executing the bare quantum-logic circuit on the quantum information processor. The virtual twirling gates and virtual correction gates can cause the quantum information processor to execute the modified quantum-logic circuit with a lower average error rate compared to executing the bare quantum-logic circuit on the quantum information processor.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. An error reduction method comprising:
defining a set of gate types that consist of a first subset of gate types and a second subset of gate types;
receiving an initial quantum-logic gate sequence at a first computer system, wherein each gate in the initial quantum-logic gate sequence is a gate type in the first subset of gate types or a gate type in the second subset of gate types and wherein the initial quantum-logic gate sequence includes at least one gate that is a gate type in the second subset of gate types;
generating, by operation of the first computer system, a modified quantum-logic gate sequence by applying a plurality of virtual random gates to the initial quantum-logic gate sequence, wherein
the initial quantum-logic gate sequence is logically equivalent to the modified quantum-logic gate sequence,
the initial quantum-logic gate sequence comprises a series of cycles,
the modified quantum-logic gate sequence includes a corresponding cycle for each cycle in the series of cycles of the initial quantum-logic gate sequence,
the modified quantum-logic gate sequence is generated by applying one or more virtual random gates in the plurality of virtual random gates in each cycle of the initial quantum-logic gate sequence,
after an initial cycle in the series of cycles, a portion of the plurality of virtual random gates applied in each cycle are configured to invert one or more of the virtual random gates applied in a preceding cycle in the series of cycles, and
each respective gate that is a gate type in the second subset of gate types in the initial quantum-logic gate sequence is preserved in the respective cycle in the modified quantum-logic gate sequence that corresponds to the cycle in the initial quantum-logic gate sequence in which the respective gate occurred, providing the modified quantum-logic gate sequence to the quantum information processor through an interface between the first computer system and the quantum information processor; and executing the modified quantum-logic gate sequence on the quantum information processor, wherein execution of the modified quantum-logic gate sequence on the quantum information incurs reduced error relative to execution of the initial quantum-logic gate sequence by converting coherent error, arising in the quantum information processor upon execution of the initial quantum-logic gate sequence, into stochastic error in the quantum information processor.

2. The error reduction method of claim 1, wherein the plurality of virtual random gates comprises virtual random Pauli gates or dihedral gates.

3. The error reduction method of claim 1, wherein providing the modified quantum-logic gate sequence to be executed by the quantum information processor comprises converting the modified quantum-logic gate sequence into machine code that is executable by the quantum information processor.

4. The error reduction method of claim 1, wherein the initial quantum-logic gate sequence comprises a bare quantum-logic circuit.

5. The error reduction method of claim 1, wherein the executing the modified quantum-logic gate sequence obtains a set of outcomes that are averaged.

6. The error reduction method of claim 1, wherein
the initial quantum-logic gate sequence comprises a bare quantum-logic circuit,
the plurality of virtual random gates comprises virtual twirling gates and virtual correction gates.

7. The error reduction method of claim 6, wherein the virtual twirling gates and the virtual correction gates are applied to individual cycles in the series of cycles.

8. The error reduction method of claim 7, wherein, after an initial cycle, the virtual correction gates applied in each cycle are configured to invert corresponding virtual twirling gates applied in a preceding cycle.

9. The error reduction method of claim 1, wherein
the first set of gates comprises the Pauli gates and the phase gate R, and
the second of gates comprises the Hardamard gate H, the $\pi/8$ gate $\sqrt{R}$ and the two-qubit controlled Z-gate $\Delta(Z)$.

10. A system comprising:
a first computer system comprising a memory and a processor;
a quantum device comprising a quantum information processor; and
an interface between the first computer system and the quantum information processor;
wherein the memory comprises one or more programs that use the processor of the first computer system to perform operations comprising:
receiving an initial quantum-logic gate sequence at the first computer system, wherein each gate in the initial quantum-logic gate sequence is a gate type in a set of gate types that consist of a first subset of gate types and a second subset of gate types and wherein the initial quantum-logic gate sequence includes at least one gate that is a gate type in the second subset of gate types;
generating a modified quantum-logic gate sequence by applying a plurality of virtual random gates to the initial quantum-logic gate sequence, wherein the initial quantum-logic gate sequence is logically equivalent to the modified quantum-logic gate sequence;
the initial quantum-logic gate sequence comprises a series of cycles,
the modified quantum-logic gate sequence includes a corresponding cycle for each cycle in the series of cycles of the initial quantum-logic gate sequence,
the modified quantum-logic gate sequence is generated by applying one or more virtual random gates in the plurality of virtual random gates in each cycle of the initial quantum-logic gate sequence,
after an initial cycle in the series of cycles, a portion of the plurality of virtual random gates applied in each cycle are configured to invert one or more of the virtual random gates applied in a preceding cycle in the series of cycles, and
each respective gate that is a gate type in the second subset of gate types in the initial quantum-logic gate sequence is preserved in the respective cycle in the modified quantum-logic gate sequence that corresponds to the cycle in the initial quantum-logic gate sequence in which the respective gate occurred;
providing the modified quantum-logic gate sequence to the quantum information processor through the interface; wherein
the quantum device executes the modified quantum-logic gate sequence on the quantum information processor, thereby incurring a reduced error relative to execution of the initial quantum-logic gate sequence, by converting coherent error, arising in the quantum information processor upon execution of the initial quantum-logic gate sequence, into stochastic error in the quantum information processor.

11. The system of claim 10, wherein the plurality of virtual random gates comprises virtual random Pauli gates or dihedral gates.

12. The system of claim 10, wherein providing the modified quantum-logic gate sequence to be executed by the quantum information processor comprises converting the modified quantum-logic gate sequence into machine code that is executable by the quantum information processor.

13. The system of claim 10, wherein the initial quantum-logic gate sequence comprises a bare quantum-logic circuit.

14. The system of claim 10, wherein the executing the modified quantum-logic gate sequence obtains a set of outcomes that are averaged.

15. The system of claim 10, wherein
the initial quantum-logic gate sequence comprises a bare quantum-logic circuit,
the plurality of virtual random gates comprises virtual twirling gates and virtual correction gates.

16. The system of claim 15, wherein the virtual twirling gates and the virtual correction gates are applied to individual cycles in the series of cycles.

17. The system of claim 16, wherein, after an initial cycle, the virtual correction gates applied in each cycle are configured to invert corresponding virtual twirling gates applied in a preceding cycle.

18. The system of claim 10, wherein
the first set of gates comprises the Pauli gates and the phase gate R, and
the second of gates comprises the Hardamard gate H, the $\pi/8$ gate $\sqrt{R}$ and the two-qubit controlled Z-gate $\Delta(Z)$.

* * * * *